(12) United States Patent
Huang

(10) Patent No.: US 11,289,401 B2
(45) Date of Patent: Mar. 29, 2022

(54) SEMICONDUCTOR PACKAGE

(71) Applicant: Powertech Technology Inc., Hsinchu County (TW)

(72) Inventor: Kun-Yung Huang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 48 days.

(21) Appl. No.: 16/412,434

(22) Filed: May 15, 2019

(65) Prior Publication Data

US 2020/0365486 A1 Nov. 19, 2020

(51) Int. Cl.
*H01L 23/495* (2006.01)
*H01L 23/34* (2006.01)
(Continued)

(52) U.S. Cl.
CPC .......... *H01L 23/433* (2013.01); *H01L 21/481* (2013.01); *H01L 21/4857* (2013.01);
(Continued)

(58) Field of Classification Search
CPC . H01L 21/481; H01L 21/4857; H01L 21/568; H01L 23/3128; H01L 23/3135; H01L 23/3672; H01L 23/49816; H01L 23/49822; H01L 23/49838; H01L 23/5383; H01L 24/16; H01L 23/49833;
(Continued)

(56) References Cited

U.S. PATENT DOCUMENTS 10,504,835 B1 * 12/2019 Wang .................. H01L 24/09
2013/0032390 A1 * 2/2013 Hu ........................ H01L 23/13
174/266
(Continued)

FOREIGN PATENT DOCUMENTS

CN 1855450 11/2006
TW 200733324 9/2007
(Continued)

OTHER PUBLICATIONS

"Office Action of Taiwan Counterpart Application", dated Apr. 7, 2020, p. 1-p. 10.

*Primary Examiner* — Caleb E Henry
*Assistant Examiner* — Dilinh P Nguyen
(74) *Attorney, Agent, or Firm* — JCIPRNET

(57) ABSTRACT

A semiconductor package and a manufacturing method thereof are provided. The semiconductor package includes a semiconductor die, an encapsulant, a redistribution layer, a polymer pattern and a heat dissipation structure. The semiconductor die has conductive pads at its active side, and is laterally encapsulated by the encapsulant. The redistribution layer is disposed at the active side of the semiconductor die, and spans over a front surface of the encapsulant. The redistribution layer is electrically connected with the conductive pads. The polymer pattern is disposed at a back surface of the encapsulant that is facing away from the front surface of the encapsulant. The semiconductor die is surrounded by the polymer pattern. The heat dissipation structure is in contact with a back side of the semiconductor die that is facing away from the active side, and extends onto the polymer pattern.

12 Claims, 28 Drawing Sheets

(51) Int. Cl.
*H01L 23/433* (2006.01)
*H01L 23/31* (2006.01)
*H01L 23/498* (2006.01)
*H01L 23/367* (2006.01)
*H01L 23/00* (2006.01)
*H01L 21/56* (2006.01)
*H01L 21/48* (2006.01)
*H01L 23/538* (2006.01)

(52) U.S. Cl.
CPC ........ *H01L 21/568* (2013.01); *H01L 23/3128* (2013.01); *H01L 23/3135* (2013.01); *H01L 23/3672* (2013.01); *H01L 23/49816* (2013.01); *H01L 23/49822* (2013.01); *H01L 23/49838* (2013.01); *H01L 23/5383* (2013.01); *H01L 24/16* (2013.01); *H01L 2224/16227* (2013.01)

(58) Field of Classification Search
CPC ... H01L 23/34; H01L 23/40; H01L 23/49568; H01L 21/56; H01L 23/28; H01L 23/3192; H01L 23/488; H01L 31/0203; H01L 31/048; H01L 31/0488; H01L 33/52; H01L 2225/06513; H01L 2225/06517

USPC ................ 257/668, 712, 675, 787, 790, 778
See application file for complete search history.

(56) References Cited

U.S. PATENT DOCUMENTS

| | | | |
|---|---|---|---|
| 2013/0087904 A1 | 4/2013 | Clark et al. | |
| 2014/0300004 A1 | 10/2014 | Choi et al. | |
| 2014/0353816 A1* | 12/2014 | Yap | H01L 23/3736 257/713 |
| 2014/0367847 A1* | 12/2014 | Strader | B23P 15/26 257/717 |
| 2016/0268178 A1* | 9/2016 | Gwin | H01L 23/10 |
| 2018/0151537 A1* | 5/2018 | Huang | H01L 21/486 |
| 2020/0203301 A1* | 6/2020 | Yu | H01L 23/4006 |

FOREIGN PATENT DOCUMENTS

| | | |
|---|---|---|
| TW | I576969 | 4/2017 |
| TW | 201737437 | 10/2017 |
| TW | 201824483 | 7/2018 |
| TW | I659509 | 5/2019 |

\* cited by examiner

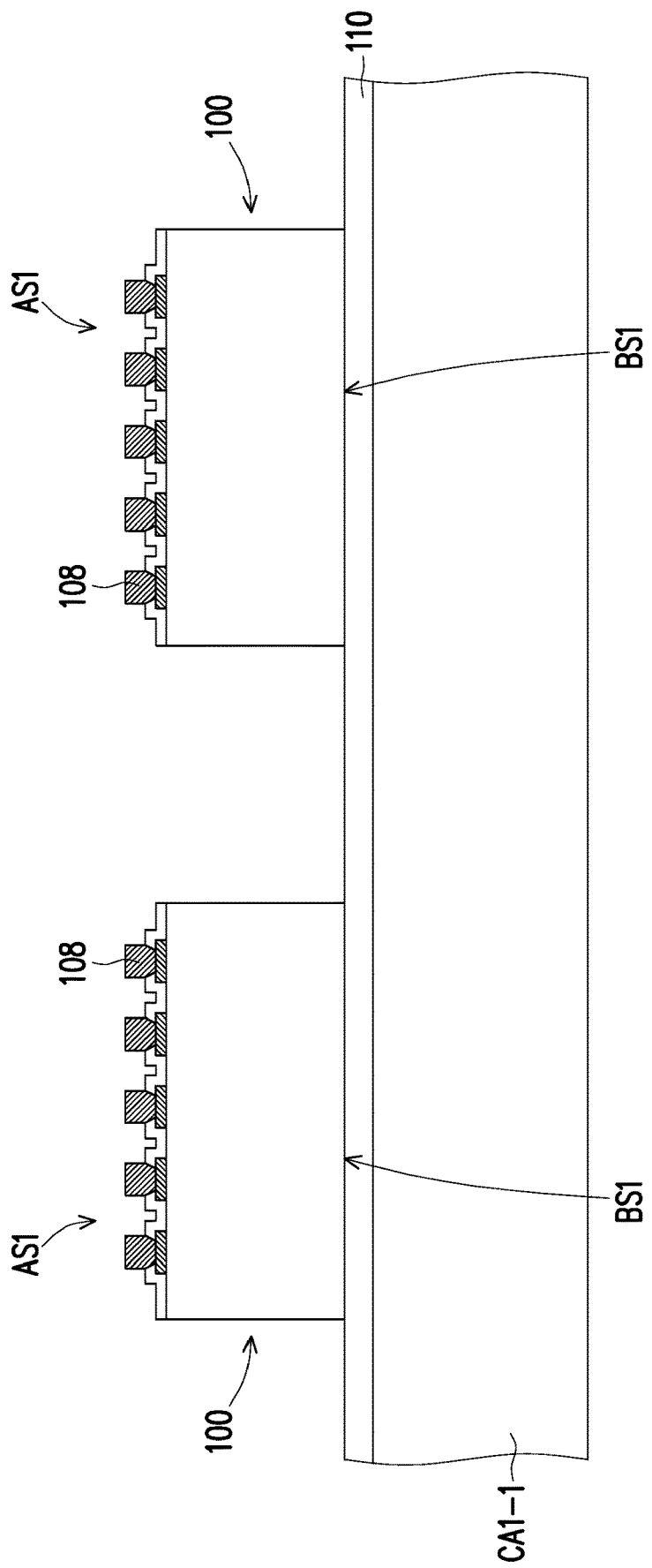

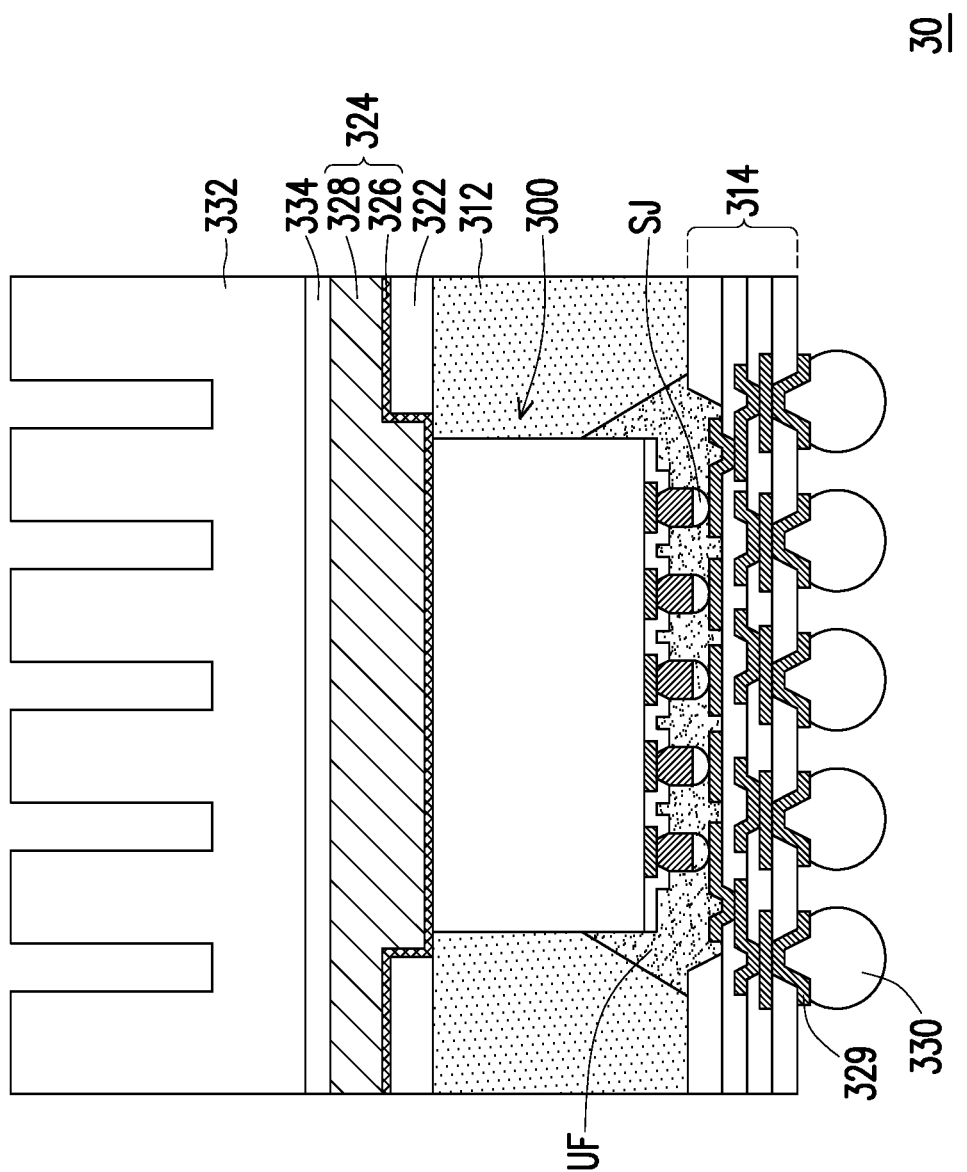

SEMICONDUCTOR PACKAGE

BACKGROUND

Technical Field

The present disclosure relates to a semiconductor package and a manufacturing method thereof, and more particularly, to a fan-out semiconductor package and a manufacturing method thereof.

Description of Related Art

Fan-out semiconductor packaging is a packaging process in which contacts of a semiconductor die are redistributed over a larger area through a redistribution layer, and provides a solution for packaging semiconductor devices that require higher integration level and greater number of external contacts. However, during manufacturing process, fan-out semiconductor package is often subjected to a high level stress, and such stress may result in warpage issues.

SUMMARY

Accordingly, the present disclosure provides a semiconductor package and a manufacturing method thereof, which is less susceptible to the warpage problem.

According to some embodiments, a semiconductor package includes a semiconductor die, an encapsulant, a redistribution layer, a polymer pattern and a heat dissipation structure. The semiconductor die has a plurality of conductive pads at an active side of the semiconductor die. The encapsulant laterally encapsulates the semiconductor die. The redistribution layer is disposed at the active side of the semiconductor die, and spans over a front surface of the encapsulant. The redistribution layer is electrically connected with the plurality of conductive pads. The polymer pattern is disposed at a back surface of the encapsulant that is facing away from the front surface of the encapsulant. The semiconductor die is surrounded by the polymer pattern. The heat dissipation structure is in contact with a back side of the semiconductor die that is facing away from the active side of the semiconductor die, and extends onto the polymer pattern.

In some embodiments, a non-zero spacing is in between the polymer pattern and the semiconductor die.

In some embodiments, a sidewall of the polymer pattern is substantially coplanar with a sidewall of the semiconductor die.

In some embodiments, a peripheral portion of the semiconductor die is covered by the polymer pattern.

In some embodiments, the heat dissipation structure is in physical contact with the back side of the semiconductor die.

In some embodiments, the heat dissipation structure comprises a seed layer and a conductive layer. The seed layer is conformally formed over the polymer pattern and the back side of the semiconductor die. The conductive layer is formed over the seed layer.

In some embodiments, a portion of the conductive layer overlapped with the semiconductor die has a first thickness, another portion of the conductive layer covering the polymer pattern has a second thickness, and the first thickness is greater than the second thickness.

In some embodiments, the semiconductor package further comprises a heat spreader, disposed over the heat dissipation structure.

In some embodiments, the semiconductor die further has a plurality of conductive pillars respectively disposed between the redistribution layer and one of the plurality of conductive pads.

In some embodiments, the semiconductor die further has a plurality of solder joints respectively disposed between the redistribution layer and one of the plurality of conductive pillars.

In some embodiments, a surface of the redistribution layer at which the semiconductor die is attached has a recess, and the semiconductor die is located in the recess.

In some embodiments, the semiconductor package further comprises an underfill, laterally surrounding the plurality of conductive pillars and the plurality of solder joints.

In some embodiments, the semiconductor package further comprises a plurality of electrical connectors, disposed at a surface of the redistribution layer facing away from the semiconductor die, and electrically connected to the redistribution layer.

According to some embodiments, a manufacturing method of semiconductor package comprises: providing a semiconductor die, wherein the semiconductor die has a plurality of conductive pads at an active side of the semiconductor die; laterally encapsulating the semiconductor die with a encapsulant; forming a redistribution layer at the active side of the semiconductor die, wherein the redistribution layer covers the plurality of conductive pads and spans over a front surface of the encapsulant; forming a polymer pattern at a back surface of the encapsulant that is facing away from the front surface of the encapsulant, wherein the polymer pattern has an opening exposing a back side of the semiconductor die that is facing away from the active side of the semiconductor die; and forming a heat dissipation structure at the back side of the semiconductor die, wherein the heat dissipation structure is in contact with the semiconductor die, and extends over the polymer pattern.

In some embodiments, the step of forming the redistribution layer precedes the steps of forming the polymer pattern and the heat dissipation structure.

In some embodiments, the manufacturing method of semiconductor package further comprises: attaching the back side of the semiconductor die onto a first carrier before laterally encapsulating the semiconductor die with the encapsulant; attaching a second carrier to the redistribution layer and detaching the first carrier from the semiconductor die and the encapsulant after forming the redistribution layer and before forming the heat dissipation structure; and detaching the second carrier from the redistribution layer after forming the heat dissipation structure.

In some embodiments, the step of forming the redistribution layer follows the steps of forming the polymer pattern and the heat dissipation structure.

In some embodiments, the manufacturing method of semiconductor package further comprises: attaching the active side of the semiconductor die onto a first carrier before laterally encapsulating the semiconductor die with the encapsulant; attaching a second carrier to the heat dissipation structure and detaching the first carrier from the semiconductor die and the encapsulant after forming the heat dissipation structure and before forming the redistribution layer; and detaching the second carrier from the heat dissipation structure after forming the redistribution layer.

According to some embodiments, a manufacturing method of semiconductor package comprises: forming a redistribution layer over a carrier; attaching a semiconductor die onto the redistribution layer, wherein the semiconductor die has a plurality of conductive pillars at an active side of the semiconductor die, and the plurality of conductive pillars are attached and electrically connected with the redistribution layer; laterally encapsulating semiconductor die with an encapsulant; forming a polymer pattern on a back surface of the encapsulant that is facing away from the redistribution layer, wherein the polymer pattern has an opening exposing a back side of the semiconductor die that is facing away from the active side of the semiconductor die; forming a heat dissipation structure over the back side of the semiconductor die, wherein the heat dissipation structure is in contact with the semiconductor die, and extends over the polymer pattern; and detaching the carrier.

In some embodiments, the manufacturing method of semiconductor package further comprises: forming a recess at a surface of the redistribution layer before attaching the semiconductor die, wherein the attached semiconductor die is located in the recess; and forming an underfill laterally surrounding the plurality of conductive pillars after attaching the semiconductor die.

As above, the semiconductor package according to embodiments in the present disclosure includes at least one semiconductor die, which is laterally encapsulated by an encapsulant. A redistribution layer is disposed at an active side of the semiconductor die and a front surface of the encapsulant, whereas a polymer pattern is formed at a back surface of the encapsulant. As such, the encapsulant is located between the redistribution layer and the polymer pattern. A coefficient of thermal expansion (CTE) of the encapsulant may be greater than or less than the CTEs of the polymer pattern and the dielectric layers in the redistribution layer. Thereby, the stress caused by the CTE mismatch between the encapsulant and the dielectric layers can be at least partially cancelled by the stress caused by the CTE mismatch between the encapsulant and the polymer pattern. Accordingly, total stress in the semiconductor package can be reduced, and the semiconductor package may be less susceptible to warpage. Furthermore, the polymer pattern is formed over a portion of the encapsulant surrounding the semiconductor die, and can be regarded as having an opening overlapped with the semiconductor die. In this way, a heat dissipation structure covering the polymer pattern can be in physical contact with the semiconductor die. Therefore, heat generated by the semiconductor dies can be more effectively dissipated through the heat dissipation structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A through FIG. 2I are cross-sectional views illustrating structures at various stages during the manufacturing process of the semiconductor package shown in FIG. 1.

FIG. 7A through FIG. 7G are cross-sectional views illustrating structures at various stages during the manufacturing process of the semiconductor package shown in FIG. 6.

DESCRIPTION OF THE EMBODIMENTS

Figure 1:
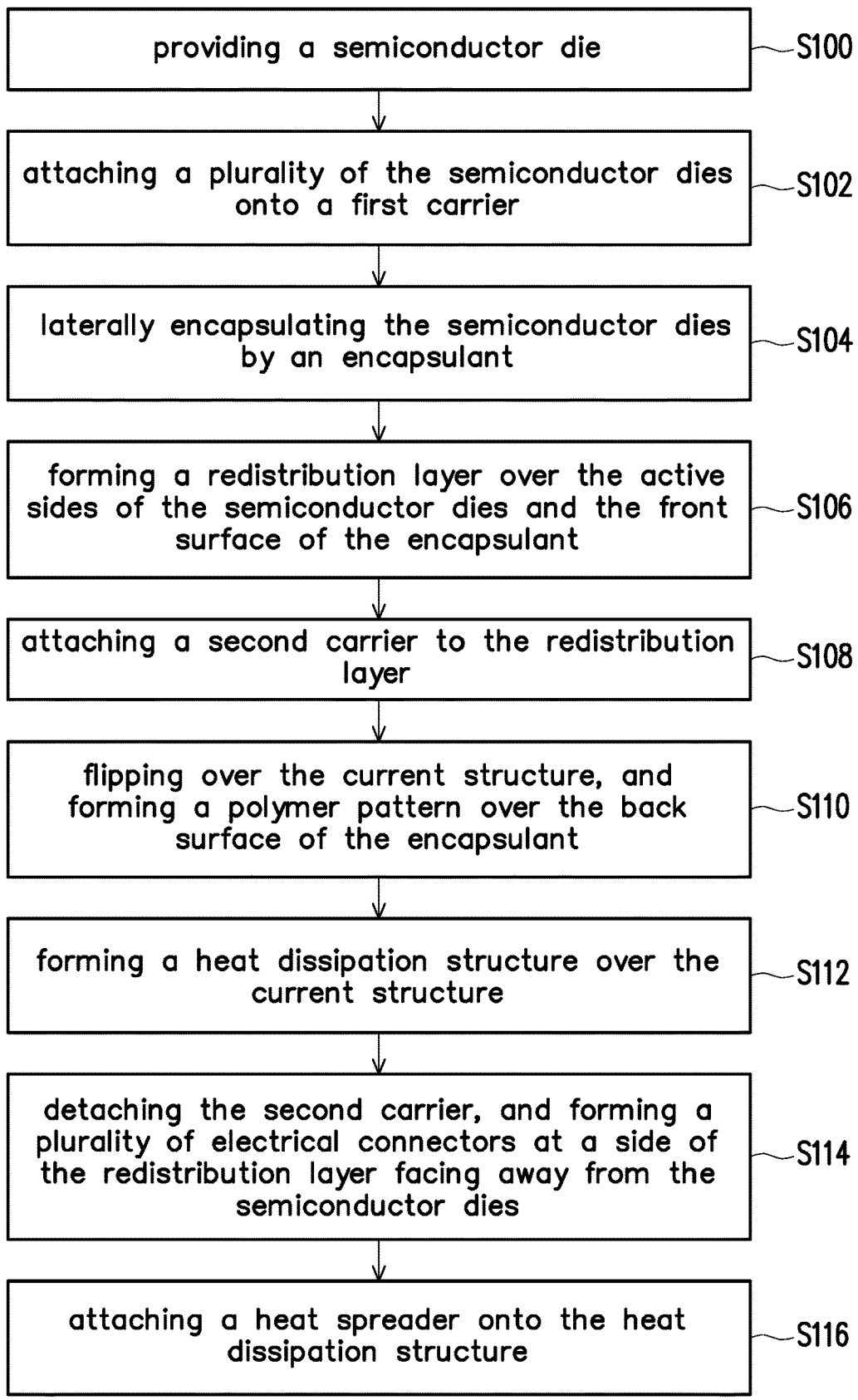
FIG. 1 is a process flow chart illustrating a manufacturing method of a semiconductor package according to some embodiments of the present disclosure.

FIG. 1 is a process flow chart illustrating a manufacturing method of a semiconductor package according to some embodiments of the present disclosure. FIG. 2A through FIG. 2I are cross-sectional views illustrating structures at various stages during the manufacturing process of the semiconductor package according to some embodiments of the present disclosure.

Figure 2A:
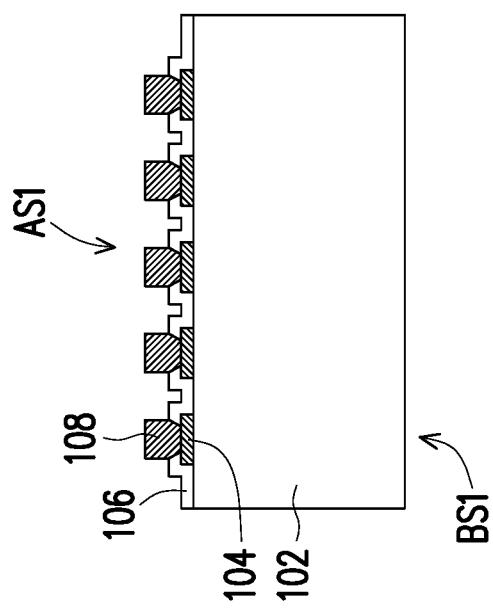

Referring to FIG. 1 and FIG. 2A, step S100 is performed, and a semiconductor die 100 is provided. The semiconductor die 100 may be a semiconductor die singulated from a device wafer. In some embodiments, the semiconductor die 100 may be a logic integrated circuit (IC) die, a memory IC die (e.g., a dynamic random access memory (DRAM) die), a system-on-chip (SOC) die, an analog IC die, an application-specific IC (ASIC) die, or the like. The semiconductor die 100 includes a semiconductor substrate 102, which may be a portion of a semiconductor wafer or a semiconductor-on-insulator (SOI) wafer. A plurality of electronic components (not shown) are formed in and/or over the semiconductor substrate 102. The electronic components include active devices and passive devices. For instance, the active devices may include transistors, diodes, the like or combinations thereof, whereas the passive devices may include resistors, capacitors, the like or combinations thereof. In addition, an interconnection layer (not shown) may be disposed over the semiconductor substrate 102, and is functioned for interconnecting the electronic components formed in and/or over the semiconductor substrate 102. A plurality of conductive pads 104 (e.g., Al pads) and a passivation layer 106 (e.g., a silicon oxide layer, a silicon nitride layer or the like) may be sequentially formed over the interconnection layer. The passivation layer 106 has a plurality of openings respectively exposing the conductive pads 104. In some embodiments, a plurality of conductive pillars 108 (e.g., copper pillars) are respectively disposed over the exposed portions of the conductive pads 104. A side of the semiconductor die 100 at which the conductive pillars 108 are located is referred as an active side AS1, whereas another side of the semiconductor die 100 facing away from the active side AS1 is referred as a back side BS1.

Referring to FIG. 1 and FIG. 2B, step S102 is performed, and a plurality of the semiconductor dies 100 are attached onto a first carrier CA1-1. The attached semiconductor dies 100 may be laterally separated from one another. Although an amount of the attached semiconductor dies 100 depicted in FIG. 2B is two, those skilled in the art may attach a single semiconductor die 100 or more than three of the semiconductor dies 100 onto the first carrier CA1-1, the present disclosure is not limited thereto. Furthermore, one or more passive devices (not shown) may also be attached onto the first carrier CA1-1. In some embodiments, the back sides BS1 of the semiconductor dies 100 are attached to the first carrier CA1-1, and the active sides AS1 of the semiconductor dies 100 are facing away from the first carrier CA1-1. The first carrier CA1-1 is, for example, a glass carrier. In some embodiments, an adhesion layer 110 is pre-formed on a surface of the first carrier CA1-1 at which the semiconductor dies 100 to be attached. In some embodiments, the adhesive layer 110 is a single layer, such as a light-to-heat conversion (LTHC) release layer or a thermal release layer. In other embodiments, the adhesive layer 110 may include multiple layers, including a release layer and a die attach film (not shown) sequentially formed on the first carrier CA1-1.

Figure 2C:
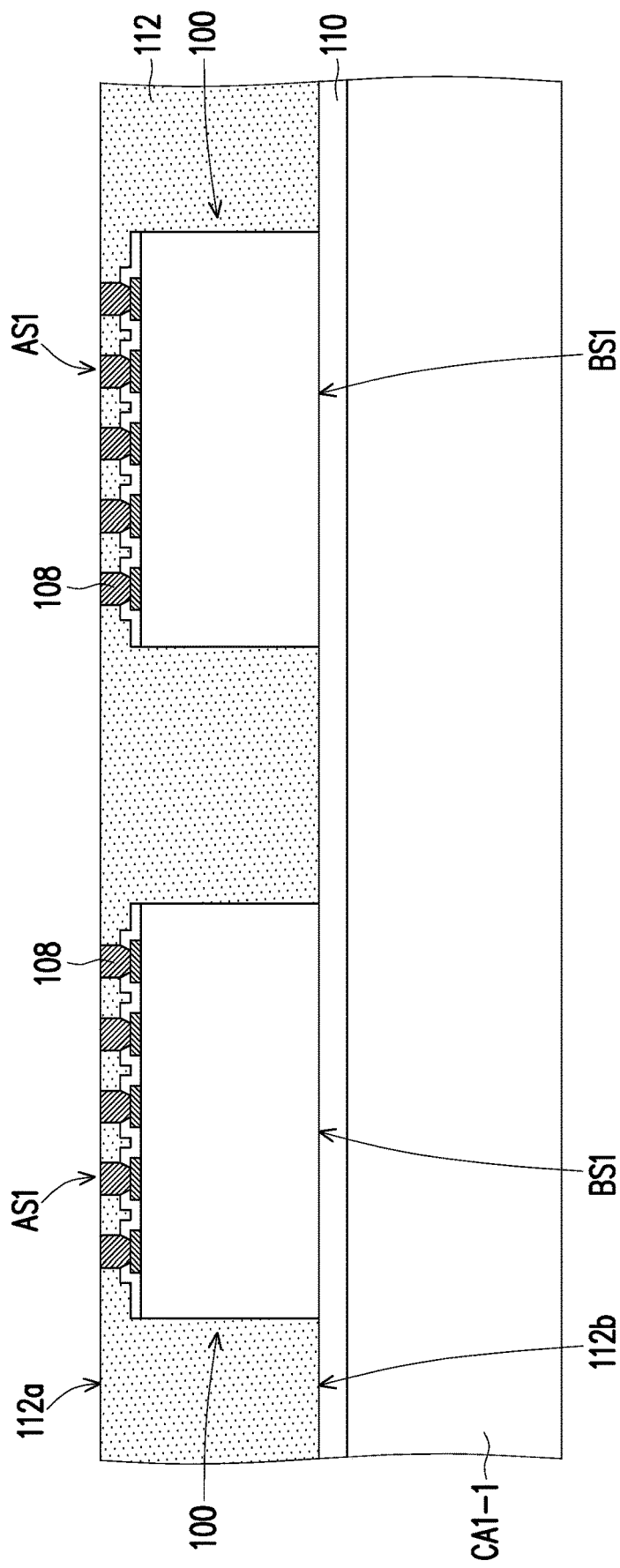

Referring to FIG. 1 and FIG. 2C, step S104 is performed, and the semiconductor dies 100 are laterally encapsulated by an encapsulant 112. In some embodiments, the semiconductor dies 100 are initially over-molded by an encapsulating material (not shown), and then a planarization process may be performed on the encapsulating material, in order to expose the conductive pillars 108 of the semiconductor dies 100 and form the encapsulant 112. In certain embodiments, top portions of the conductive pillars 108 may be partially removed during the planarization process. In addition, after performing the planarization process, top surfaces of the conductive pillars 108 may be substantially coplanar with a front surface 112a of the encapsulant 112. On the other side, a back surface 112b of the encapsulant 112, which is facing away from the front surface 112a, may be coplanar with a back surfaces of the semiconductor substrates 102 at the back sides BS1 of the semiconductor dies 100. In some embodiments, a material of the encapsulant 112 may include epoxy resin, polyimide, silicone, the like or a combination thereof, and the planarization process may be a chemical mechanical polishing process, an etching process or a grinding process.

Figure 2D:
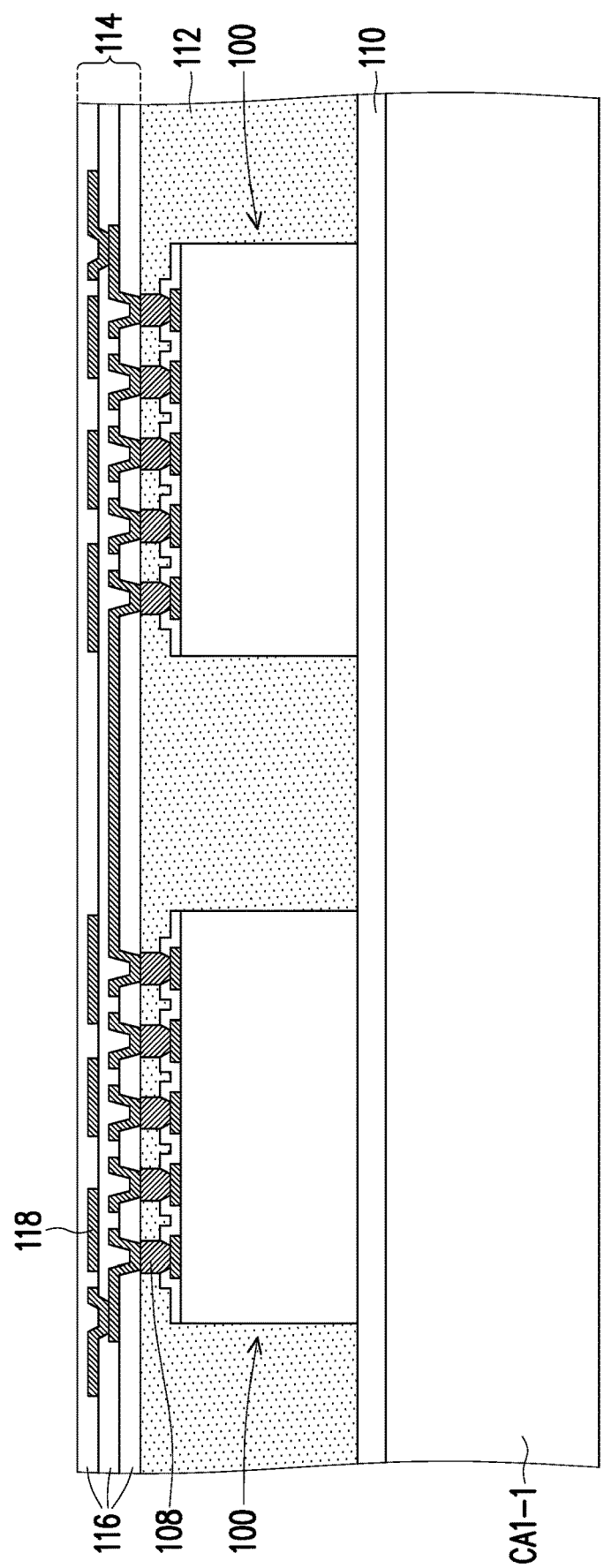

Referring to FIG. 1, FIG. 2C and FIG. 2D, step S106 is performed, and a redistribution layer 114 is formed over the active sides AS1 of the semiconductor dies 100 and the front surface 112a of the encapsulant 112. The redistribution layer 114 covers the top surfaces of the conductive pillars 108 of the semiconductor dies 100, and spans over the front surface 112a of the encapsulant 112. In some embodiments, the redistribution layer 114 includes a stack of insulating layers 116, and includes redistribution elements 118 formed in the stack of the insulating layers 116. The redistribution elements 118 are electrically connected with the conductive pillars 108 of the semiconductor dies 100, and fan out to a range of the reconstructed wafer including the semiconductor dies 100 and the encapsulant 112. At least one of the redistribution elements 118 may be electrically connected between the conductive pillars 108 from laterally adjacent semiconductor dies 100, and is functioned as a die-to-die interconnection. The redistribution elements 118 may respectively include a conductive trace, a conductive via or a combination thereof. The conductive trace extends along one or more directions substantially parallel to an extending direction of the insulating layers 116, whereas the conductive via penetrates at least one of the insulating layer 116 and electrically connects to one of the conductive traces. In some embodiments, a material of the insulating layers 116 includes a polymer material, whereas a material of the redistribution elements 118 includes a metal or a metal alloy. For instance, the polymer material includes polyimide, polybenzoxazole (PBO), benzocyclobutene (BCB), the like or a combination thereof, and the metal/metal alloy includes copper, nickel, titanium, the like or a combination thereof. In alternative embodiments, the insulating layers 116 are inorganic insulating layers, and are made of, for example, silicon oxide, silicon nitride or the like.

Figure 2E:
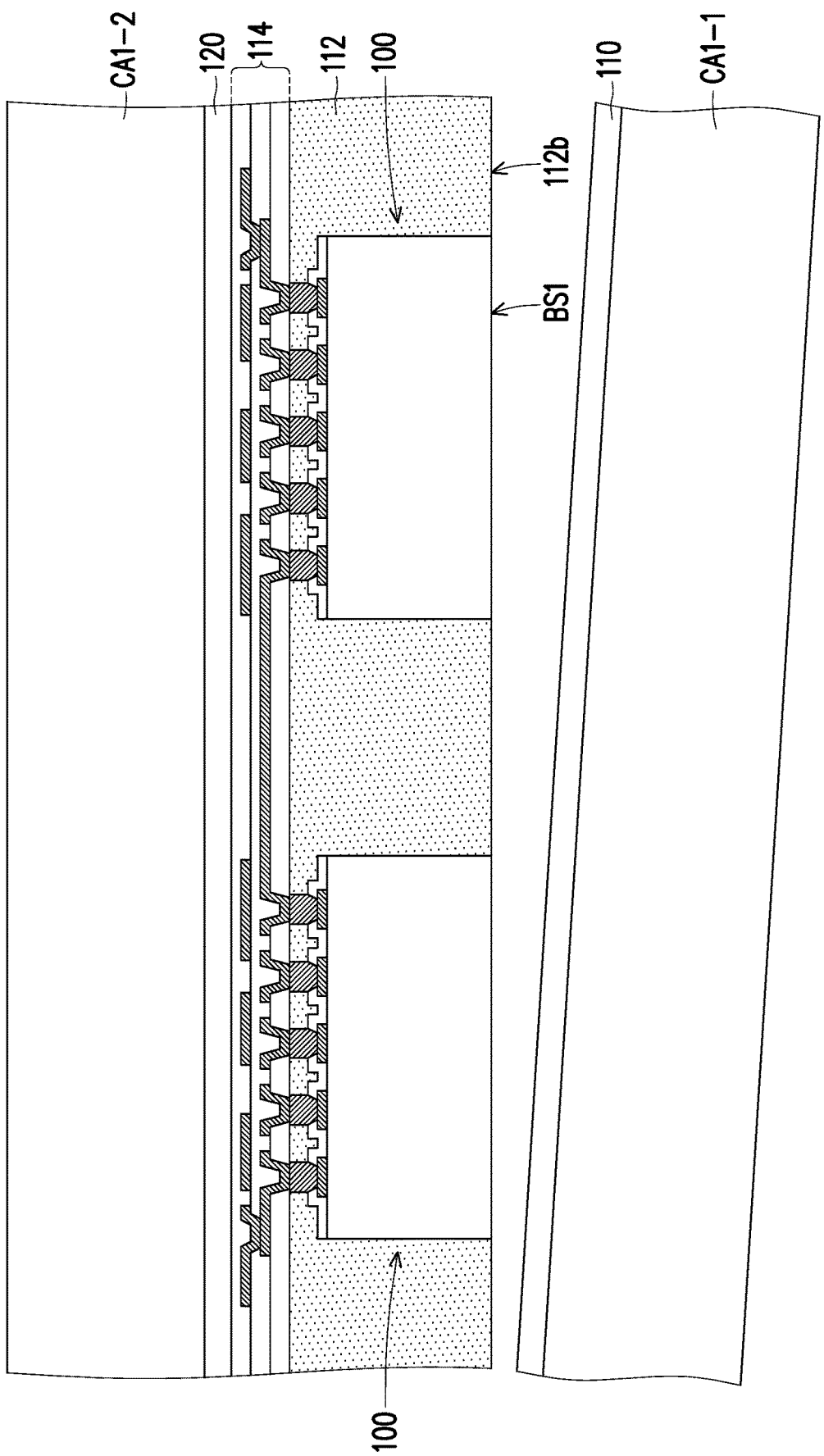

Referring to FIG. 1 and FIG. 2E, step S108 is performed, and a second carrier CA1-2 is attached to the redistribution layer 114, whereas the first carrier CA1-1 is detached from the encapsulant 112 and the semiconductor dies 100. In some embodiments, an adhesion layer 120 is per-formed on a surface of the second carrier CA1-2 at which the redistribution layer 114 to be attached. For instance, the adhesion layer 120 may be a LTHC release layer or a thermal release layer. On the other side, in those embodiments where the adhesion layer 110 formed on the first carrier CA1-1 is a LTHC release layer or a thermal release layer, the first carrier CA1-1 is detached from the semiconductor dies 100 and the encapsulant 112 as the adhesion layer 110 lose its adhesive property when exposed to light or heat. After detaching the first carrier CA1-1, the back sides BS1 of the semiconductor dies 100 and the back surface 112b of the encapsulant 112 are exposed.

Figure 2F:
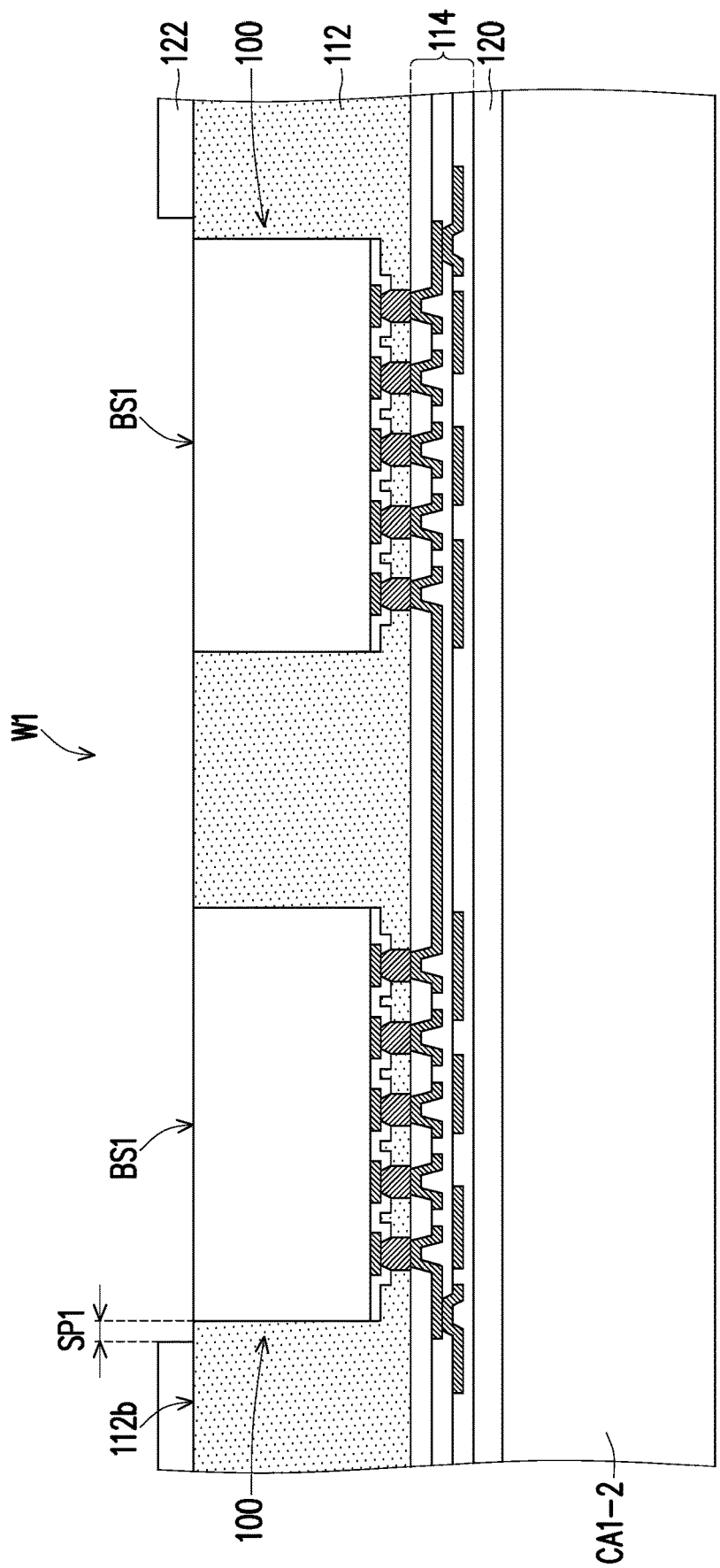

Referring to FIG. 1, FIG. 2E and FIG. 2F, step S110 is performed, such that the structure shown in FIG. 2E is flipped over, and a polymer pattern 122 is formed over the back surface 112b of the encapsulant 112. A portion of the encapsulant 112 surrounding the semiconductor dies 100 is covered by the polymer pattern 122. On the other hand, the back sides BS1 of the semiconductor dies 100 and a portion of the encapsulant 112 between the semiconductor dies 100 are still exposed. In other words, the semiconductor dies 100 and the portion of the encapsulant 112 between the semiconductor dies 100 are surrounded by the overlying polymer pattern 122, and are currently exposed. The polymer pattern 122 may be regarded as having an opening W1 overlapped with the semiconductor dies 100 and the portion of the encapsulant 112 between the semiconductor dies 100. In some embodiments, as shown in FIG. 2F, the polymer pattern 122 is not overlapped with the semiconductor dies 100, and a non-zero spacing SP1 is in between a boundary of the opening W1 and the closest semiconductor dies 100. A material of the polymer pattern 122 may be different from a material of the encapsulant 112, and may be the same as the material of the dielectric layer 116 of the redistribution layer 114 (as shown in FIG. 2D). For instance, the polymer pattern 122 may be made of polyimide, polybenzoxazole (PBO), benzocyclobutene (BCB), epoxy, the like or a combination thereof. In addition, a formation method of the polymer pattern 122 may include initially forming a blanket polymer layer (not shown) on a back side of the reconstructed wafer facing away from the redistribution layer 114, and then patterning the blanket polymer layer to form the polymer pattern 122 having an opening W1 exposing the semiconductor dies 100 and the portion of the encapsulant 112 between the semiconductor dies 100. In some embodiments, the polymer pattern 122 is formed as a mesh pattern having a plurality of openings W1 respectively exposing one or more of the semiconductor dies 100 in the reconstructed wafer. In alternative embodiments, the polymer pattern 122 is formed in a ring shape that surrounds all of the semiconductor dies 100 in the reconstructed wafer.

Figure 2G:
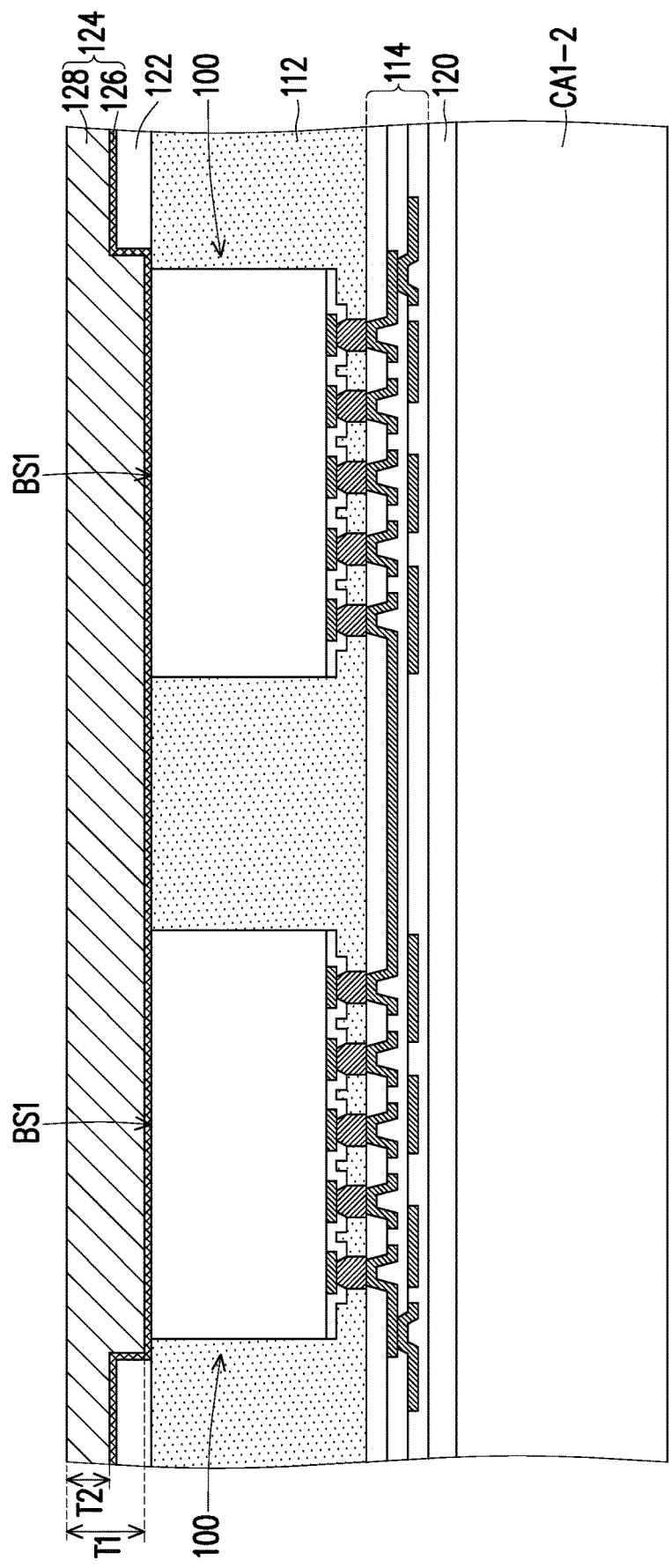

Referring to FIG. 1, FIG. 2F and FIG. 2G, step S112 is performed, and a heat dissipation structure 124 is formed over the current structure. The opening W1 of the polymer pattern 122 can be regarded as being filled by the heat dissipation structure 124, and the heat dissipation structure 124 further extends onto the polymer pattern 122 along a sidewall and a top surface of the polymer pattern 122. Thereby, the heat dissipation structure 124 covers the semiconductor dies 100 and a portion of the encapsulant 112 between the semiconductor dies 100, and is in contact with the polymer pattern 122 along both lateral and vertical directions. In some embodiments, the heat dissipation structure 124 is in physical contact with the back sides BS1 of the semiconductor dies 100 and the portion of the encapsulant 112 between the semiconductor dies 100. In those embodiments where the polymer pattern 122 is laterally separated from the semiconductor dies 100, the heat dissipation structure 124 further covers a portion of the encapsulant 112 surrounding the semiconductor dies 100. In some embodiments, the heat dissipation structure 124 includes a seed layer 126 and a conductive layer 128 formed over the seed layer 126. The seed layer 126 is conformally formed over the package structure shown in FIG. 2F by, for example, a physical vapor deposition (PVD) process, and the polymer pattern 122, the back sides BS1 of the semiconductor dies 100 and the portion of the encapsulant 112 located between the semiconductor dies 100 are covered by the seed layer 126. Subsequently, the conductive layer 128 is formed over the seed layer 126 by, for example, a plating process. In some embodiments, the conductive layer 128 fills up the opening W1 of the polymer pattern 122, and further extends onto the polymer pattern 122. In addition, the conductive layer 128 may be formed by a non-conformal manner, and a thickness T1 of a portion of the conductive layer 128 overlapped with the semiconductor dies 100 may be greater than a thickness T2 of another portion of the conductive layer 128 covering the polymer pattern 122. Alternatively, the conductive layer 128 may be formed by a conformal manner, and may have a substantially constant thickness. A material of the seed layer 126 may include copper, titanium, the like or a combination thereof, whereas a material of the conductive layer 128 may include copper.

Figure 2H:
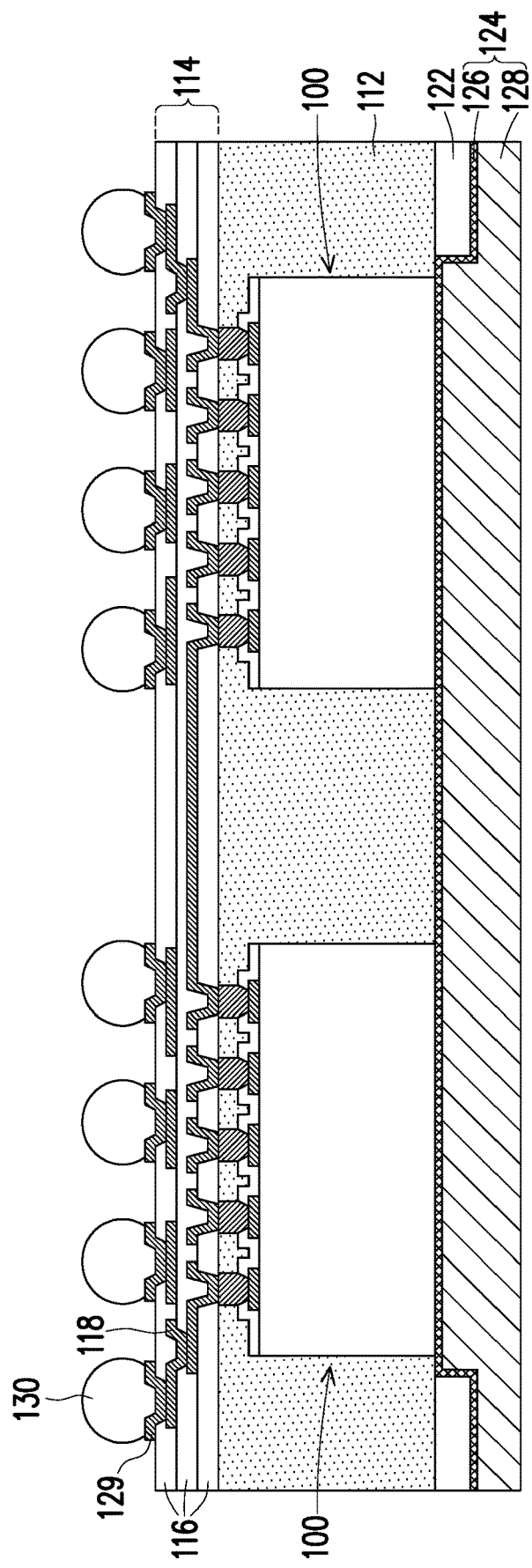

Referring to FIG. 1, FIG. 2G and FIG. 2H, step S114 is performed, such that the second carrier CA1-2 is detached, and a plurality of electrical connectors 130 are formed at a side of the redistribution layer 114 facing away from the semiconductor dies 100. Before detaching the second carrier CA1-2, the package structure shown in FIG. 2G may be flipped over, and the heat dissipation structure 124 may be attached to a tape or another carrier (not shown). In those embodiments where the adhesion layer 120 formed on the second carrier CA1-2 is a LTHC release layer or a thermal release layer, the second carrier CA1-2 is detached from the redistribution layer 114 as the adhesion layer 120 lose its adhesive property when exposed to light or heat. A surface of the redistribution layer 114 facing away from the encapsulant 112 (i.e., the topmost dielectric layer 116 as shown in FIG. 2H) is exposed when the second carrier CA1-2 is detached. After detaching the second carrier CA1-2, a singulation process may be performed on the current package structure. Each singulated package structure may contain one or more semiconductor dies 100 (e.g., two semiconductor dies 100 as shown in FIG. 2H) laterally encapsulated by the encapsulant 112. The semiconductor die(s) 100 in each singulated package structure is surrounded by the polymer pattern 122, and in contact with the heat dissipation structure 124. The singulation process is, for example, a dicing process, a sawing process or a laser ablation process. Subsequently, some portions of the exposed dielectric layer 116 (e.g., the topmost dielectric layer 116 shown in FIG. 2H) may be removed to form openings exposing some portions of the redistribution elements 118 in the redistribution layer 114, and electrical connectors 130 may be respectively formed on the exposed redistribution elements 118. In some embodiments, under ball metallization (UBM) layers 129 are respectively formed in the openings of the exposed dielectric layer 116 before forming the electrical connectors 130. As such, the UBM layers 129 may be disposed between the electrical connectors 130 and the redistribution layer 114, respectively. In some embodiments, the UBM layers 129 further extend onto a surface of the exposed dielectric layer 116 outside the afore-mentioned openings. The electrical connectors 130 may include micro-bumps, controlled collapse chip connection (C4) bumps, ball grid array (BGA) balls, solder balls or the like A material of the UBM layer 129 may include Cr, Cu, Ti, W, Ni, Al, Au, the like or combinations thereof.

Figure 2I:
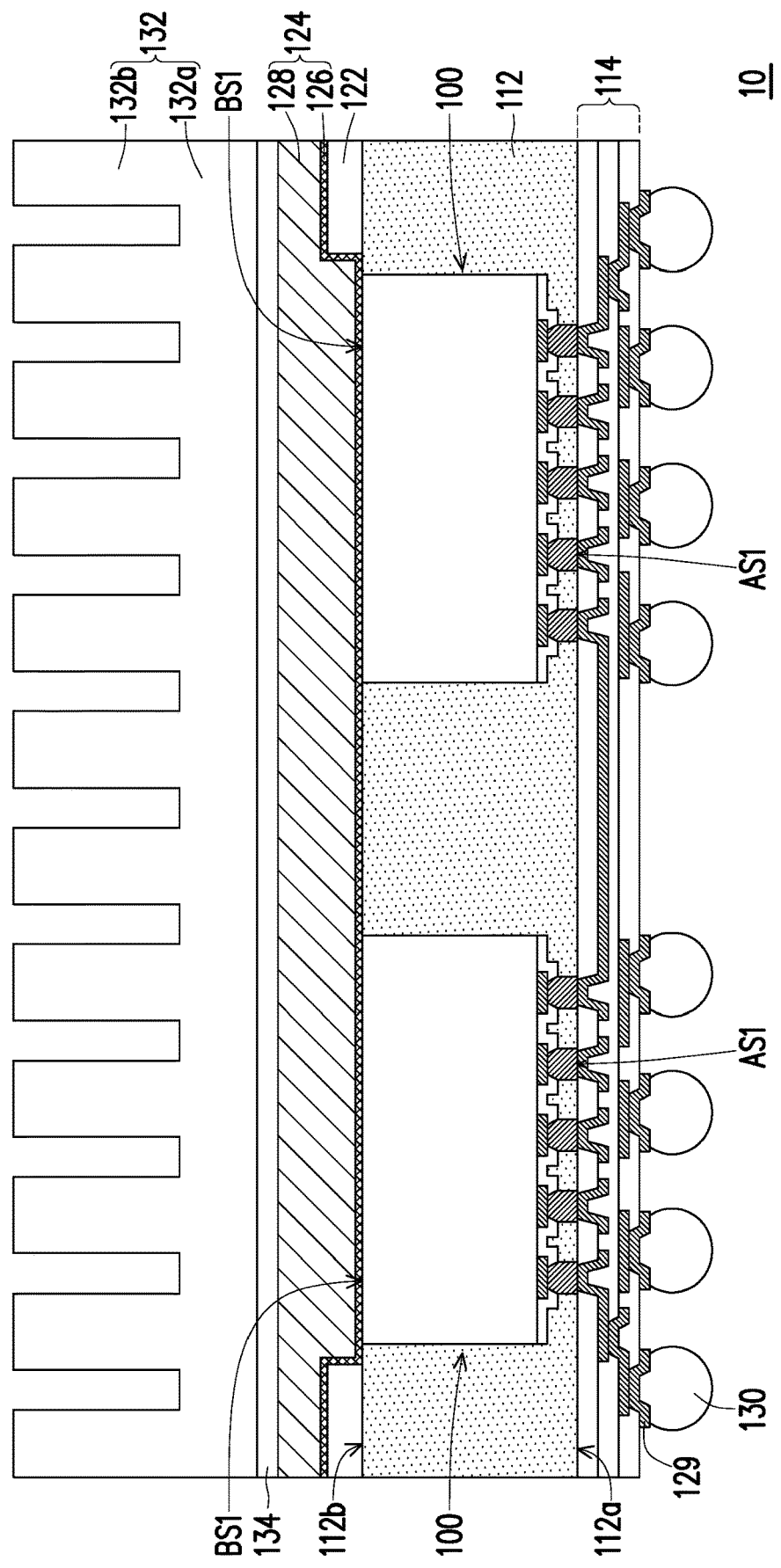

Referring to FIG. 1 and FIG. 2I, step S116 is performed, and a heat spreader 132 is attached onto the heat dissipation structure 124. In some embodiments, before attaching the heat spreader 132, the tape or carrier (not shown) attached to the heat dissipation structure 124 is detached, and a thermal interfacial material (TIM) layer 134 may be formed on a surface of the heat dissipation structure 124 on which the heat spreader 132 is subsequently attached. As shown in FIG. 2I, in some embodiments, the heat spreader 132 has a base portion 132a and a plurality of protrusion portions 132b protruding from the base portion 132a. The protrusion portions 132b may be fin structures or pillars. In alternative embodiments, the heat spreader 132 is a metal plate, and does not have protrusion portions. A material of the heat spreader 132 may include copper, aluminum, or other metals, and a material of the TIM layer 134 may include a polymer material (e.g., thermal grease or thermal tape) containing conductive material such as metal or metal oxide particles.

According to the embodiments described above, the step of singulation follows the step of detaching the second carrier CA1-2, and precedes the step of forming the electrical connectors 130. However, in alternative embodiments, the step of forming the electrical connectors 130 may precede the step of detaching second carrier CA1-2 and the step of singulation. Those skilled in the art may adjust the order of these steps, the present disclosure is not limited thereto.

Up to here, a semiconductor package 10 is formed. The semiconductor dies 100 in the semiconductor package 10 is laterally encapsulated by the encapsulant 112. The redistribution layer 114 is disposed at the active sides AS1 of the semiconductor dies 100 and the front surface 112a of the encapsulant 112, whereas the polymer pattern 122 is formed at the back surface 112b of the encapsulant 112. In other words, the encapsulant 112 is disposed between the redistribution layer 114 and the polymer pattern 122. A coefficient of thermal expansion (CTE) of the encapsulant 112 may be greater than or less than the CTEs of the polymer pattern 122 and the dielectric layers 116 in the redistribution layer 114. As such, the stress caused by the CTE mismatch between the encapsulant 112 and the dielectric layers 116 can be at least partially cancelled by the stress caused by the CTE mismatch between the encapsulant 112 and the polymer pattern 122. Accordingly, total stress in the semiconductor package 10 can be reduced, and the semiconductor package 10 may be less susceptible to warpage. For instance, the encapsulant 112 is made of epoxy molding compound (EMC) with fillers, and has a CTE of 5 ppm/° C. to 20 ppm/° C. On the other hand, the dielectric layers 116 of the redistribution layer 114 and the polymer pattern 122 are made of polyimide, and have a CTE of 50 ppm/° C. to 60 ppm/° C. Furthermore, the polymer pattern 122 is formed over a portion of the encapsulant 112 surrounding the semiconductor dies 100, and can be regarded as having an opening W1 (as shown in FIG. 2F) overlapped with the semiconductor dies 100 and a portion of the encapsulant 112 between the semiconductor dies 100. In this way, the heat dissipation structure 124 covering the polymer pattern 122 can be in contact with the back sides BS1 of the semiconductor dies 100 and the portion of the encapsulant 112 between the semiconductor dies 100. Therefore, heat generated by the semiconductor dies 100 can be more effectively dissipated through the heat dissipation structure 124.

Figure 3:
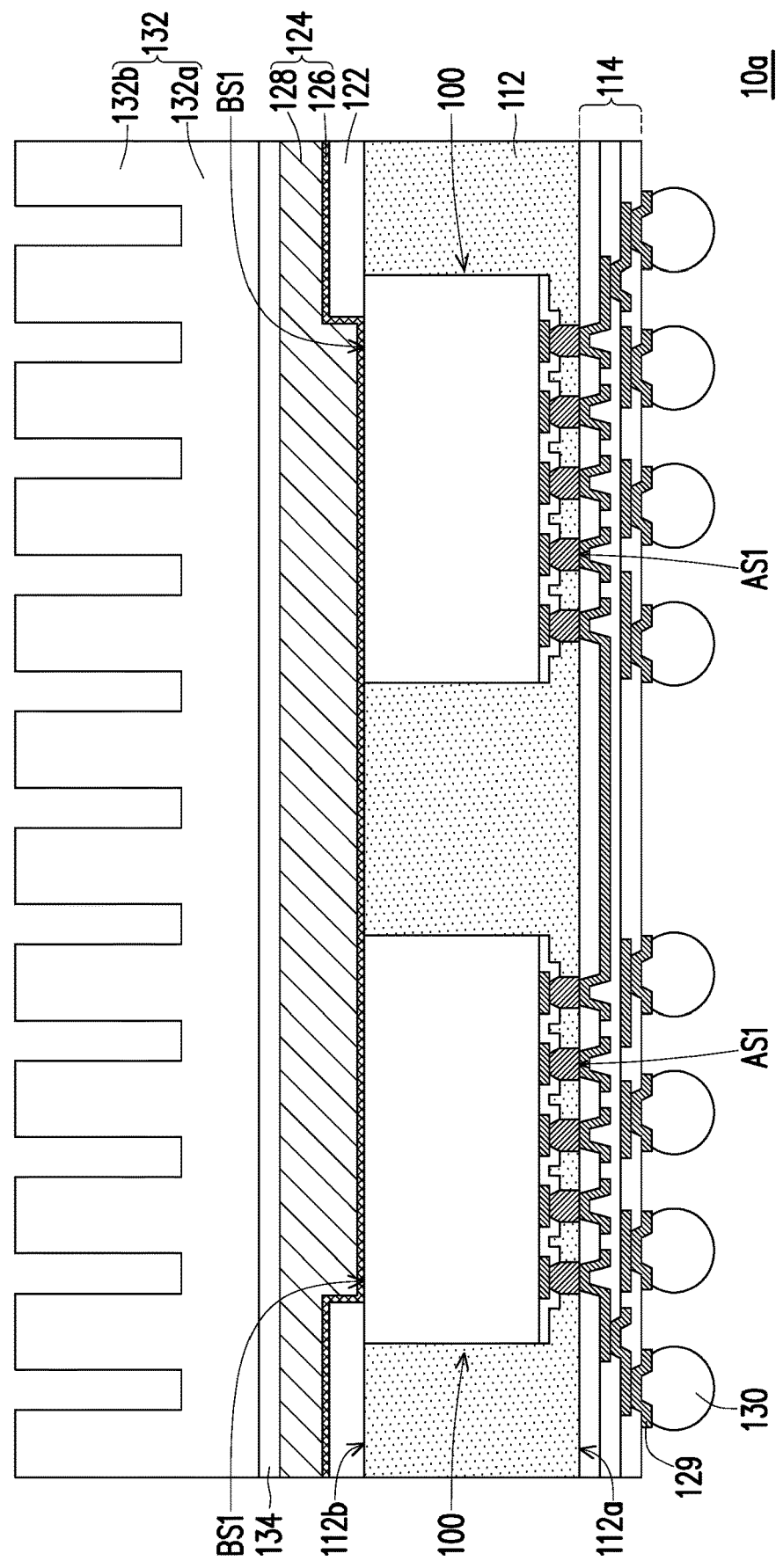
FIG. 3 is a cross-sectional view illustrating a semiconductor package according to some embodiments of the present disclosure.

FIG. 3 is a cross-sectional view illustrating a semiconductor package 10a according to some embodiments of the present disclosure.

Referring to FIG. 2I and FIG. 3, the semiconductor package 10a shown in FIG. 3 is similar to the semiconductor package 10 shown in FIG. 2I. Only differences therebetween will be described, the like or the same parts will not be repeated. As shown in FIG. 3, in some embodiments, the polymer pattern 122 further extends onto the back sides BS1 of the semiconductor dies 100. In these embodiments, some peripheral portions of the semiconductor dies 100 are covered by the polymer pattern 122, and are not in direct contact with the heat dissipation structure 124. By increasing an area of the polymer pattern 122, the stress caused by the CTE mismatch between the encapsulant 112 and the dielectric layers 116 of the redistribution layer 114 can be more greatly cancelled by the stress caused by the CTE mismatch between the encapsulant 112 and the polymer pattern 122. Therefore, total stress in the semiconductor package 10a can be further reduced.

In alternative embodiments (not shown), the boundary of the opening W1 of the polymer pattern 122 is substantially coplanar with a sidewall of the adjacent semiconductor dies 100. In these alternative embodiments, the opening W1 of the polymer pattern 122 filled by the heat dissipation structure 124 spans to the boundary of a distribution region of the semiconductor dies 100.

Figure 4:
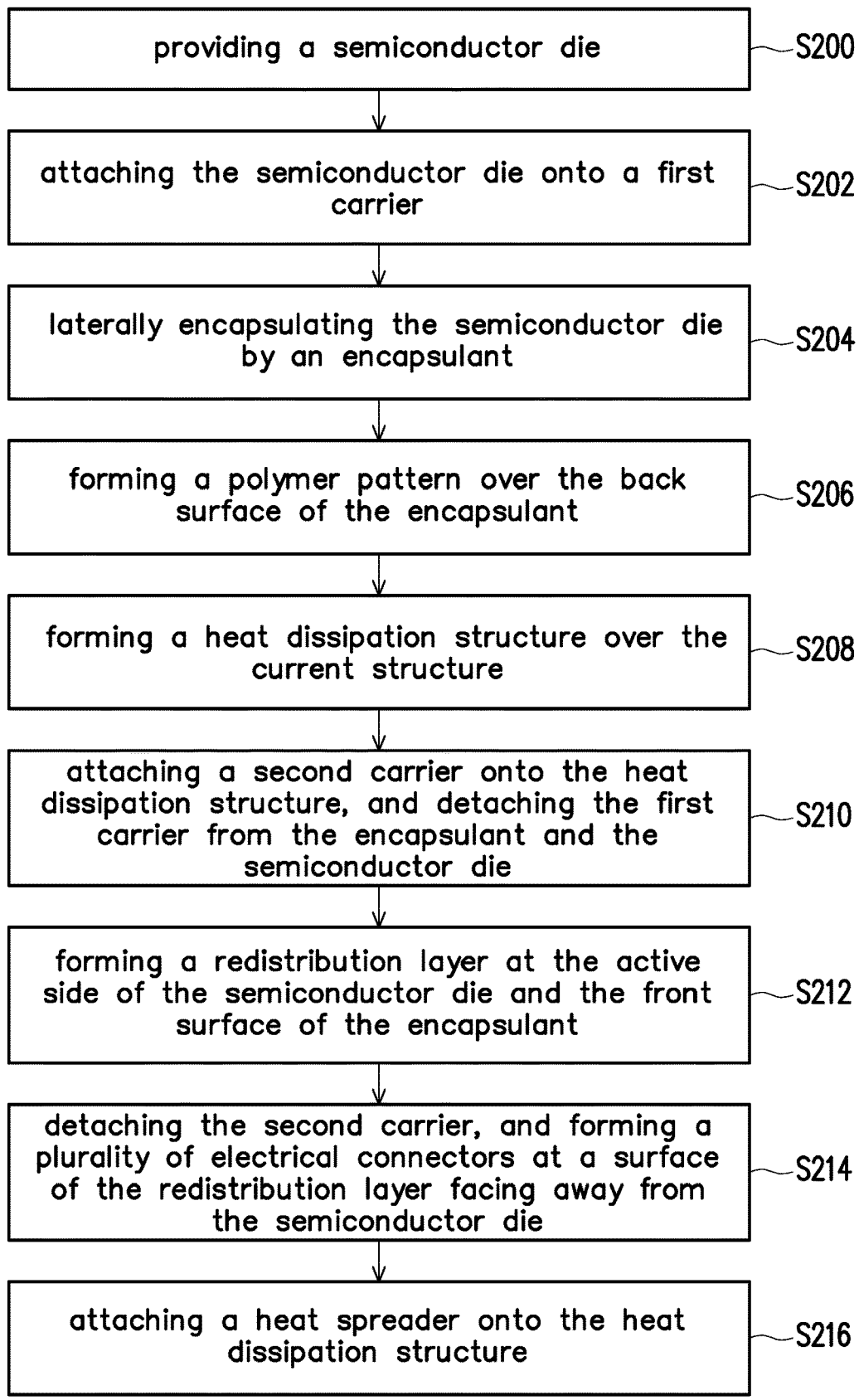
FIG. 4 is a process flow chart illustrating a manufacturing method of a semiconductor package according to some embodiments of the present disclosure.

FIG. 4 is a process flow chart illustrating a manufacturing method of a semiconductor package according to some embodiments of the present disclosure. FIG. 5A through FIG. 5H are cross-sectional views illustrating structures at various stages during the manufacturing process of the semiconductor package shown in FIG. 4. The embodiments to be illustrated with reference to FIG. 4 and FIG. 5A through FIG. 5H are similar to the embodiments illustrated with reference to FIG. 1 and FIG. 2A through FIG. 2I, only differences therebetween will be described, whereas the like or the same parts will not be repeated again. In addition, the like numeral references are designated as the similar components.

Figure 5A:
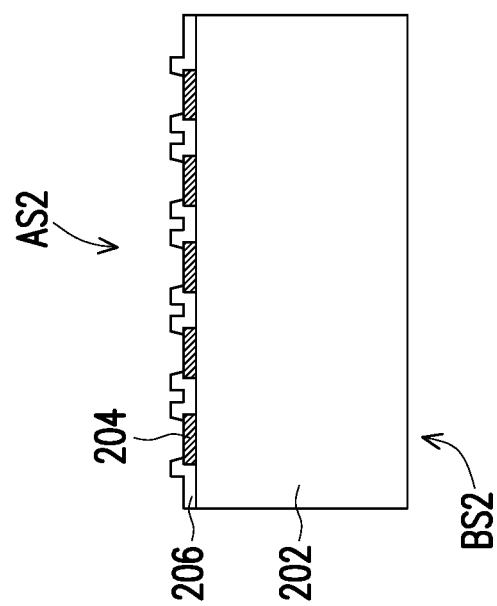
FIG. 5A through FIG. 5H are cross-sectional views illustrating structures at various stages during the manufacturing process of the semiconductor package shown in FIG. 4.

Referring to FIG. 4 and FIG. 5A, step S200 is performed, and a semiconductor die 200 is provided. The semiconductor die 200 is similar to the semiconductor die 100 shown in FIG. 2A, except that the semiconductor die 200 may not have the conductive pillars (e.g. the conductive pillars 108 shown in FIG. 2A) at its active side AS2. As shown in FIG. 5A, the conductive pads 204 disposed over a semiconductor substrate 202 are exposed by openings of the passivation layer 206 formed over the conductive pads 204, and are not covered by the conductive pillars. On the other hand, a side of the semiconductor die 200 facing away from the active side AS2 is referred as a back side BS2.

Figure 5B:
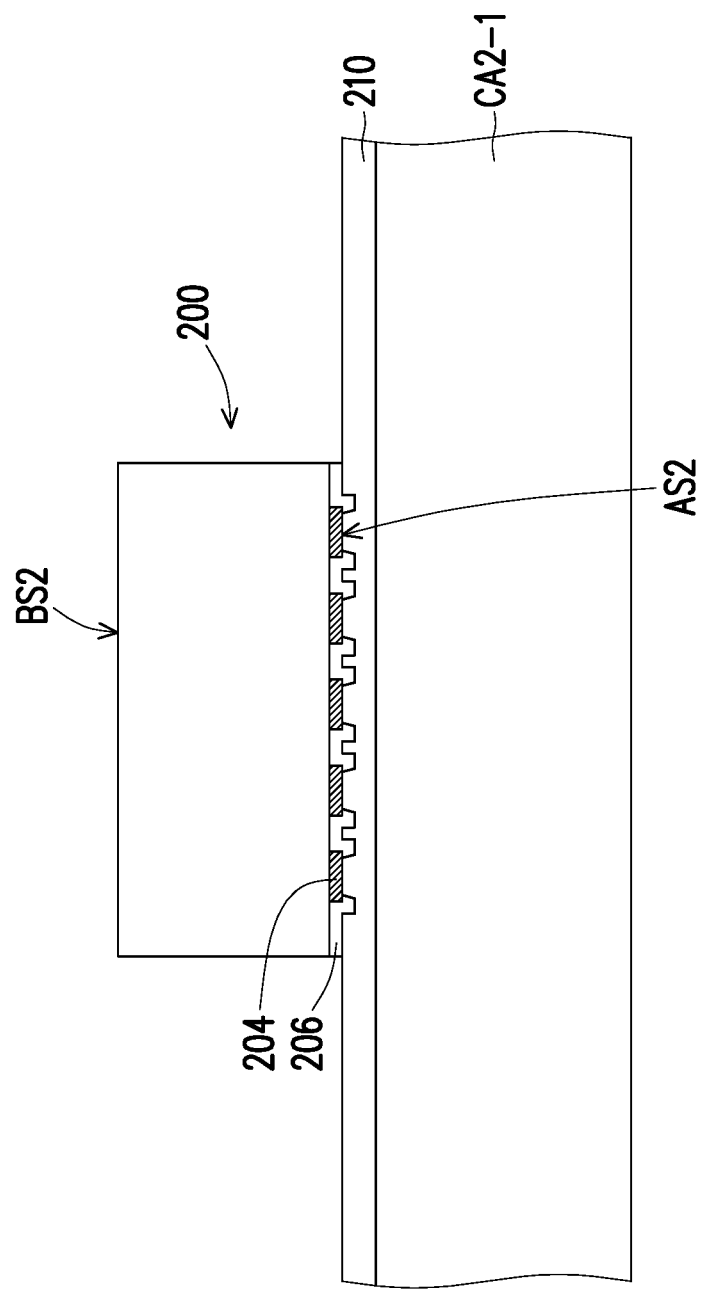

Referring to FIG. 4, FIG. 5A and FIG. 5B, step S202 is performed, and the semiconductor die 200 is attached onto a first carrier CA2-1. The active side AS2 of the semiconductor die 200 is attached to the first carrier CA2-1, whereas the back side BS2 of the semiconductor die 200 faces away from the first carrier CA2-1. In some embodiments, an adhesion layer 210, such as a LTHC layer or a thermal release layer, is pre-formed on a surface of the first carrier CA2-1 at which the semiconductor die 200 to be attached. In these embodiments, the conductive pads 204 and the passivation layer 206 of the attached semiconductor die 200 are in contact with the adhesion layer 210. It should be noted that, even though only a single semiconductor die 200 is depicted in FIG. 5B, a plurality of the semiconductor dies 200 may actually be attached onto the first carrier CA2-1, and these attached semiconductor dies 200 may be laterally separated from one another. Furthermore, one or more passive devices (not shown) may also be attached onto the first carrier CA2-1.

Figure 5C:
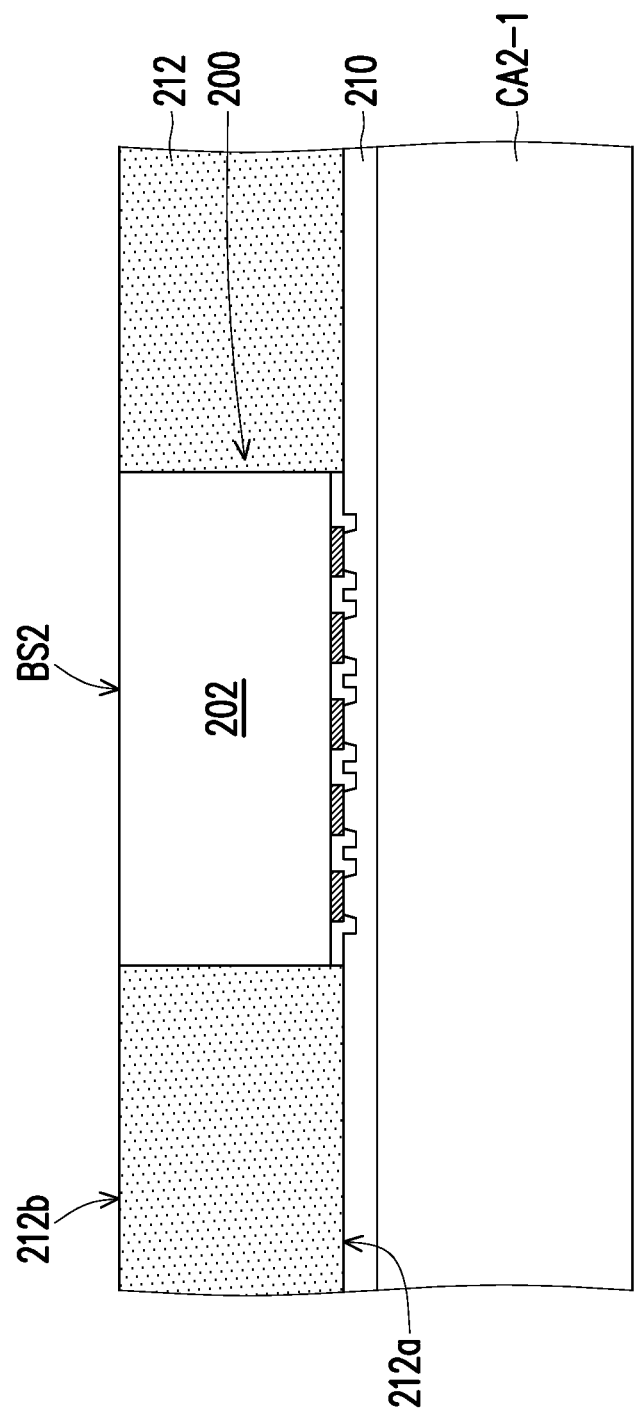

Referring to FIG. 4 and FIG. 5C, step S204 is performed, and the attached semiconductor die 200 is laterally encapsulated by an encapsulant 212. The back side BS2 of the semiconductor die 200 is exposed by the encapsulant 212. In some embodiments, a back surface 212b of the encapsulant 212 is substantially coplanar with a back surface of the semiconductor substrate 202 at the back side BS2 of the semiconductor die 200. On the other side, a front surface 212a of the encapsulant 212 is in contact with the adhesion layer 210 or the first carrier CA2-1. It should be noted that, even though only a single semiconductor die 200 is depicted as being laterally encapsulated by the encapsulant 212, a plurality of the semiconductor dies 200 may be laterally encapsulated by the encapsulant 212.

Figure 5D:
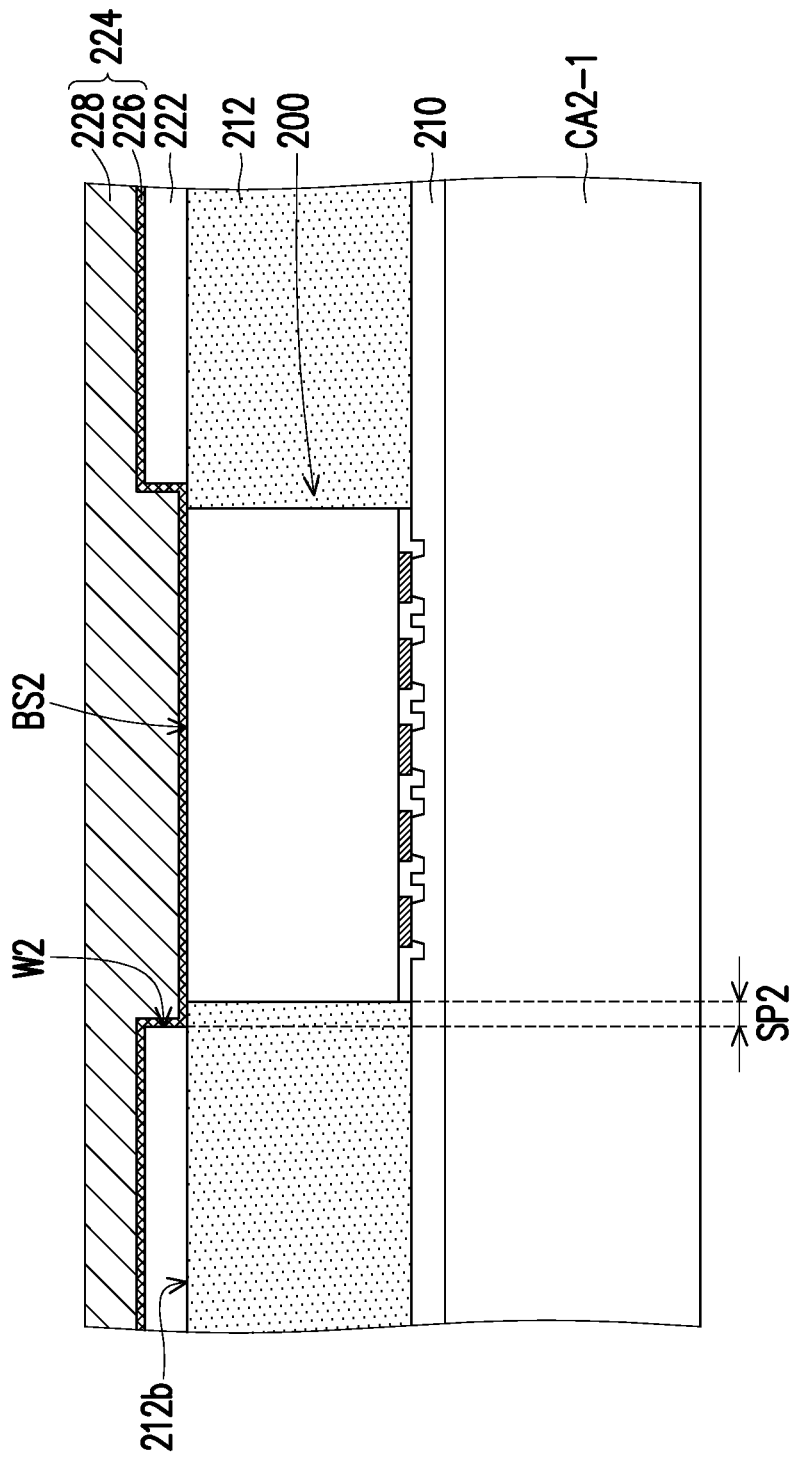

Referring to FIG. 4 and FIG. 5D, step S206 is performed, and a polymer pattern 222 is formed over the back surface 212b of the encapsulant 212. A portion of the encapsulant 212 surrounding the semiconductor dies 200 is covered by the polymer pattern 222. The polymer pattern 122 can be regarded as having an opening W2 overlapped with the semiconductor die 200. In some embodiments, the semiconductor die 200 is not covered by the polymer pattern 222, and a non-zero spacing SP2 is in between a boundary of the opening W2 of the polymer pattern 222 and the semiconductor die 200. In alternative embodiments, the polymer pattern 222 further extends onto the back side BS2 the semiconductor die 200, and a peripheral portion of the semiconductor die 200 is covered by the polymer pattern 222. In other embodiments, the boundary of opening W2 of the polymer pattern 222 is substantially coplanar with a sidewall of the semiconductor die 200.

Thereafter, step S208 is performed, and a heat dissipation structure 224 is formed over the current structure. The opening W2 of the polymer pattern 222 can be regarded as being filled by the heat dissipation structure 224, and the heat dissipation structure 224 further extends onto the polymer pattern 222 along a sidewall and a top surface of the polymer pattern 222. As such, the back side BS2 of the semiconductor die 200 and the polymer pattern 222 are covered by the heat dissipation structure 224, and the heat dissipation structure 224 is in contact with the polymer pattern 222 along both lateral and vertical directions. In some embodiments, the heat dissipation structure 224 is in physical contact with the semiconductor die 200, and is functioned for dissipating heat generated by the semiconductor die 200. In addition, in some embodiments, the heat dissipation structure 224 includes a seed layer 226 and a conductive layer 228. The seed layer 226 is conformally formed over the semiconductor die 200 and the polymer pattern 222, and the conductive layer 228 is formed over the seed layer 226. In some embodiments, the conductive layer 228 may have a substantially flat top surface. In these embodiments, a thickness of a portion of the conductive layer 228 filled in the opening W2 is greater than a thickness of another portion of the conductive layer 228 located outside the opening W2.

Figure 5E:
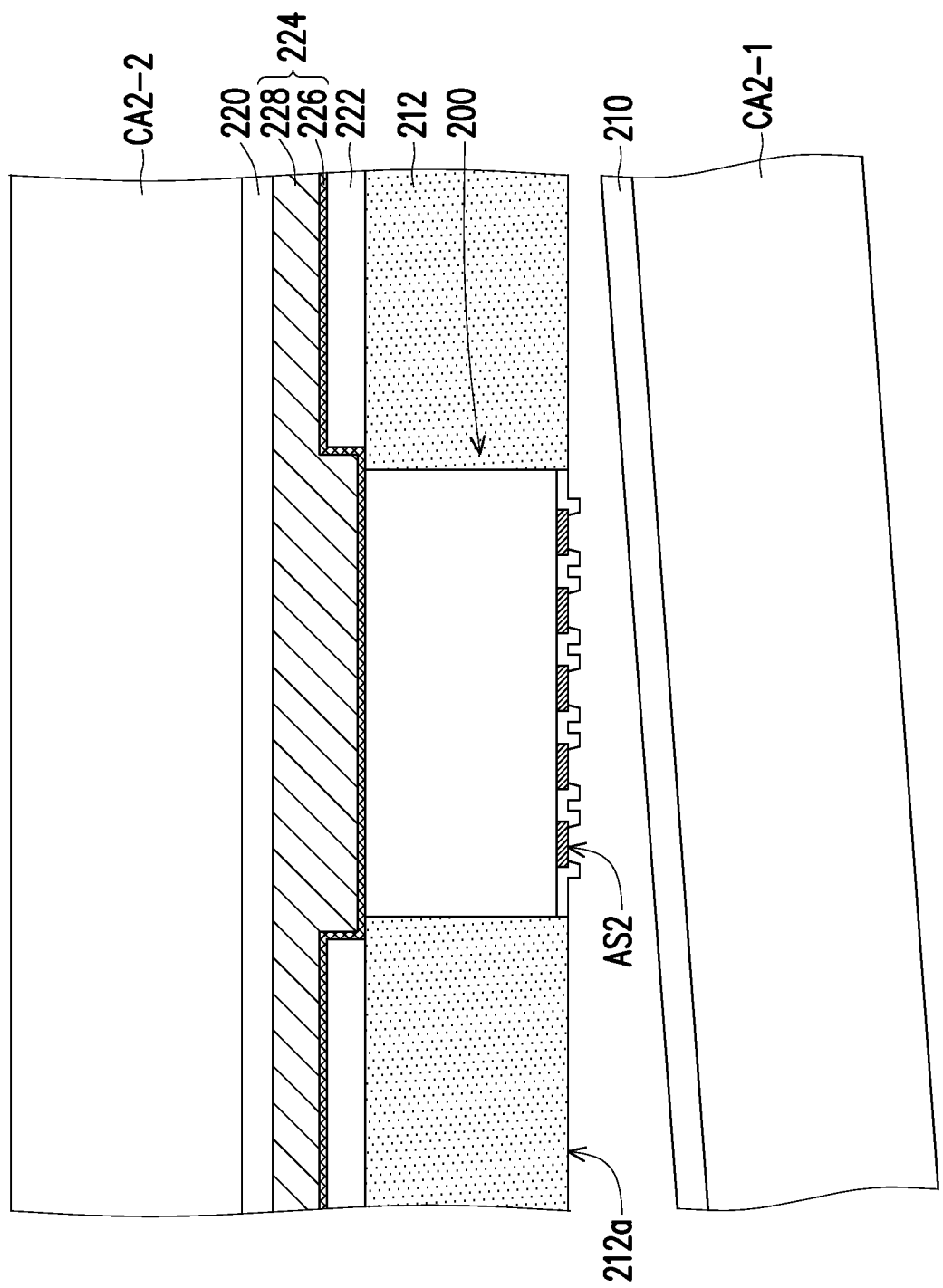

Referring to FIG. 4 and FIG. 5E, step S210 is performed, such that a second carrier CA2-2 is attached onto the heat dissipation structure 224, and the first carrier CA2-1 is detached from the encapsulant 212 and the semiconductor die 200. In some embodiments, an adhesion layer 220, such as a LTHC release layer or a thermal release layer, is per-formed on a surface of the second carrier CA2-2 at which the heat dissipation structure 224 to be attached. On the other side, in those embodiments where the adhesion layer 210 formed on the first carrier CA2-1 is a LTHC release layer or a thermal release layer, the first carrier CA2-1 is detached from the semiconductor dies 200 and the encapsulant 212 as the adhesion layer 210 lose its adhesive property when exposed to light or heat. After detaching the first carrier CA2-1, the active side AS2 of the semiconductor die 200 and the front surface 212a of the encapsulant 212 are exposed.

Figure 5F:
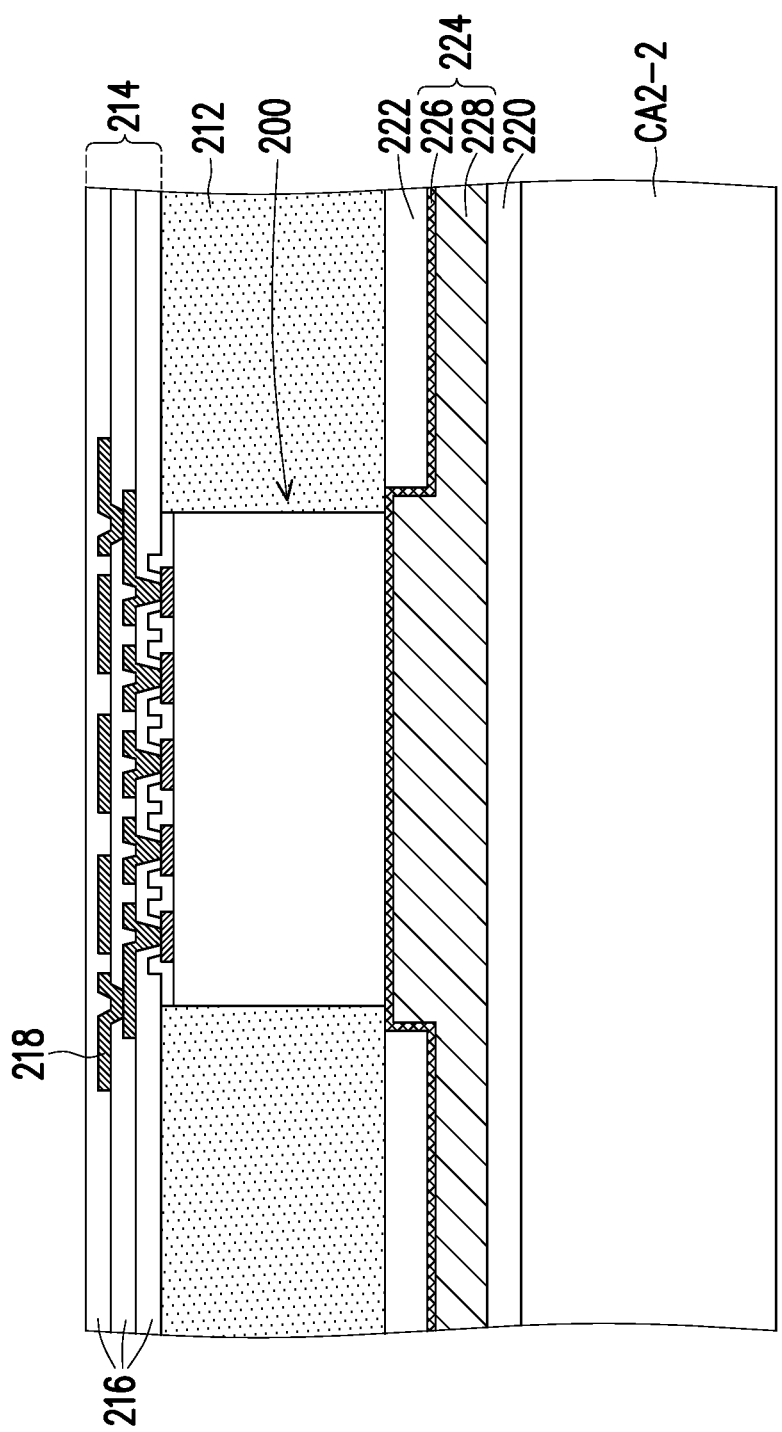

Referring to FIG. 4, FIG. 5E and FIG. 5F, step S212 is performed, and a redistribution layer 214 is formed at the active side AS2 of the semiconductor die 200 and the front surface 212a of the encapsulant 212. Before forming the redistribution layer 214, the structure shown in FIG. 5E may be flipped over, such that the active side AS2 of the semiconductor die 200 and the front surface 212a of the encapsulant 212 currently face upward. In some embodiments, the redistribution layer 214 includes a stack of insulating layers 216, and includes redistribution elements 218 formed in the stack of the insulating layers 216. The redistribution elements 218 are electrically connected with the conductive pads 206 of the semiconductor die 200, and fan out to a range of the reconstructed wafer including the semiconductor die 200 and the encapsulant 212.

Figure 5G:
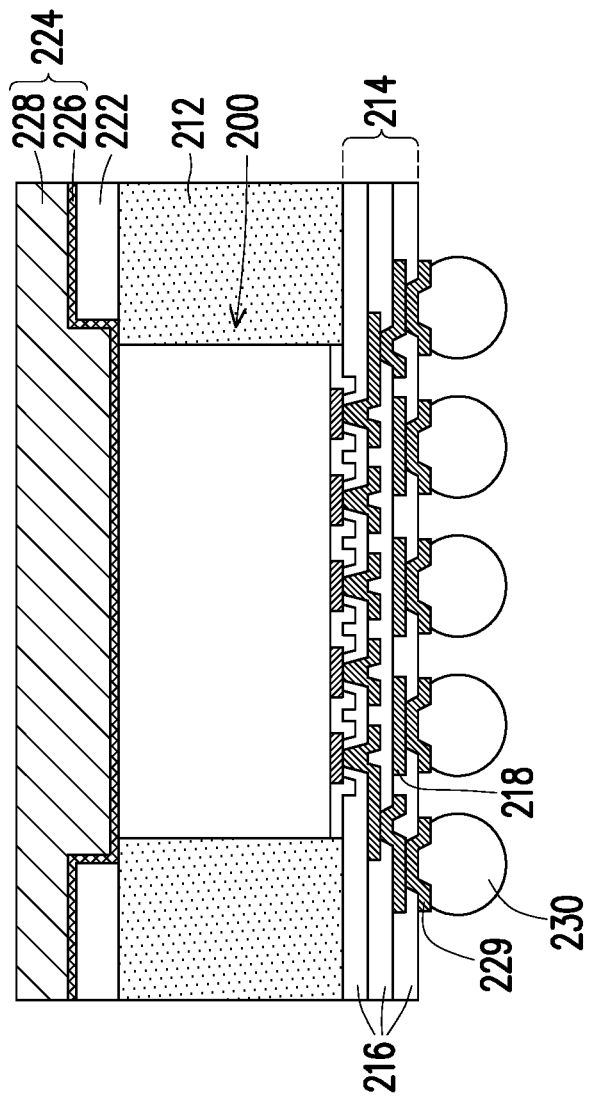

Referring to FIG. 4 and FIG. 5G, step S214 is performed, such that the second carrier CA2-2 is detached, and a plurality of electrical connectors 230 are formed at a surface of the redistribution layer 214 facing away from the semiconductor die 200. Before detaching the second carrier CA2-2 and forming the electrical connectors 230, the structure shown in FIG. 5F may be flipped over, and the redistribution layer 214 may be attached to a tape or another carrier (not shown). In those embodiments where the adhesion layer 220 formed on the second carrier CA2-2 is a LTHC release layer or a thermal release layer, the second carrier CA2-2 is detached from the heat dissipation structure 224 as the adhesion layer 220 lose its adhesive property when exposed to light or heat. After detaching the second carrier CA2-2, a singulation process may be performed on the current package structure. Each singulated package structure may contain one or more semiconductor dies 200 (e.g., one semiconductor die 200 as shown in FIG. 5G) laterally encapsulated by the encapsulant 212. The semiconductor die(s) 200 in each singulated package structure is surrounded by the overlying polymer pattern 222, and in contact with the heat dissipation structure 224. Subsequently, the tape or carrier (not shown) attached to the redistribution layer 214 is detached, and some portions of the currently exposed dielectric layer 216 (e.g., the bottom-most dielectric layer 216 shown in FIG. 5G) may be removed to form openings exposing some portions of the redistribution elements 218 in the redistribution layer 214. Thereafter, the electrical connectors 230 may be respectively disposed at the exposed redistribution elements 218. In some embodiments, UBM layers 229 are respectively formed at the exposed portions of the redistribution layer 214 before forming the electrical connectors 230, such that the UBM layers 229 could be located between the redistribution layer 214 and the electrical connectors 230 after the electrical connectors 230 are formed.

According to the embodiments described above, the step of singulation follows the step of detaching the second carrier CA2-2, and precedes the step of forming the electrical connectors 230. However, in alternative embodiments, the step of forming the electrical connectors 230 may precede the step of detaching second carrier CA2-2 and the step of singulation. Those skilled in the art may adjust the order of these steps, the present disclosure is not limited thereto.

Figure 5H:
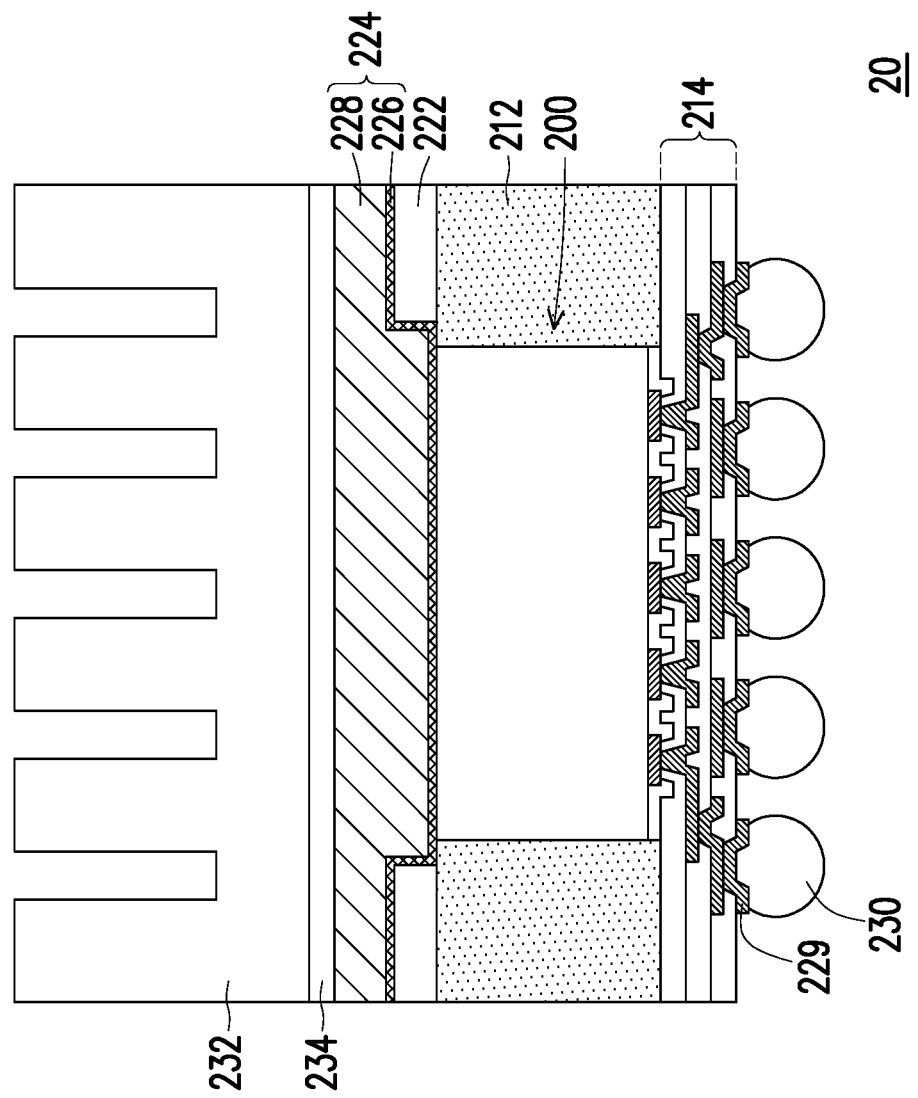

Referring to FIG. 4 and FIG. 5H, step S216 is performed, and a heat spreader 232 is attached onto the heat dissipation structure 224. In some embodiments, before attaching the heat spreader 232, a TIM layer 234 may be formed on a surface of the heat dissipation structure 224 on which the heat spreader 232 is subsequently attached.

Up to here, a semiconductor package 20 is formed. A structure of the semiconductor package 20 is similar to a structure of the semiconductor package 10 shown in FIG. 2I, except that the semiconductor die 200 of the semiconductor package 20 may not have the conductive pillars. Regarding a manufacturing process of the semiconductor package 20, the active side AS2 of the semiconductor die 200 is attached to the first carrier CA2-1 (as shown in FIG. 5B), and the steps of forming the polymer pattern 222 and the heat dissipation structure 224 (as shown in FIG. 5D) precedes the step of forming the redistribution layer 214 (as shown in FIG. 5F). On the other hand, during manufacturing process of the semiconductor package 10, the back sides BS1 of the semiconductor dies 100 are attached to the first carrier CA1-1 (as shown in FIG. 2B), and the step of forming the redistribution layer 114 (as shown in FIG. 2D) is followed by the steps of forming the polymer pattern 122 and the heat dissipation structure 124 (as shown in FIG. 2F and FIG. 2G).

Figure 6:
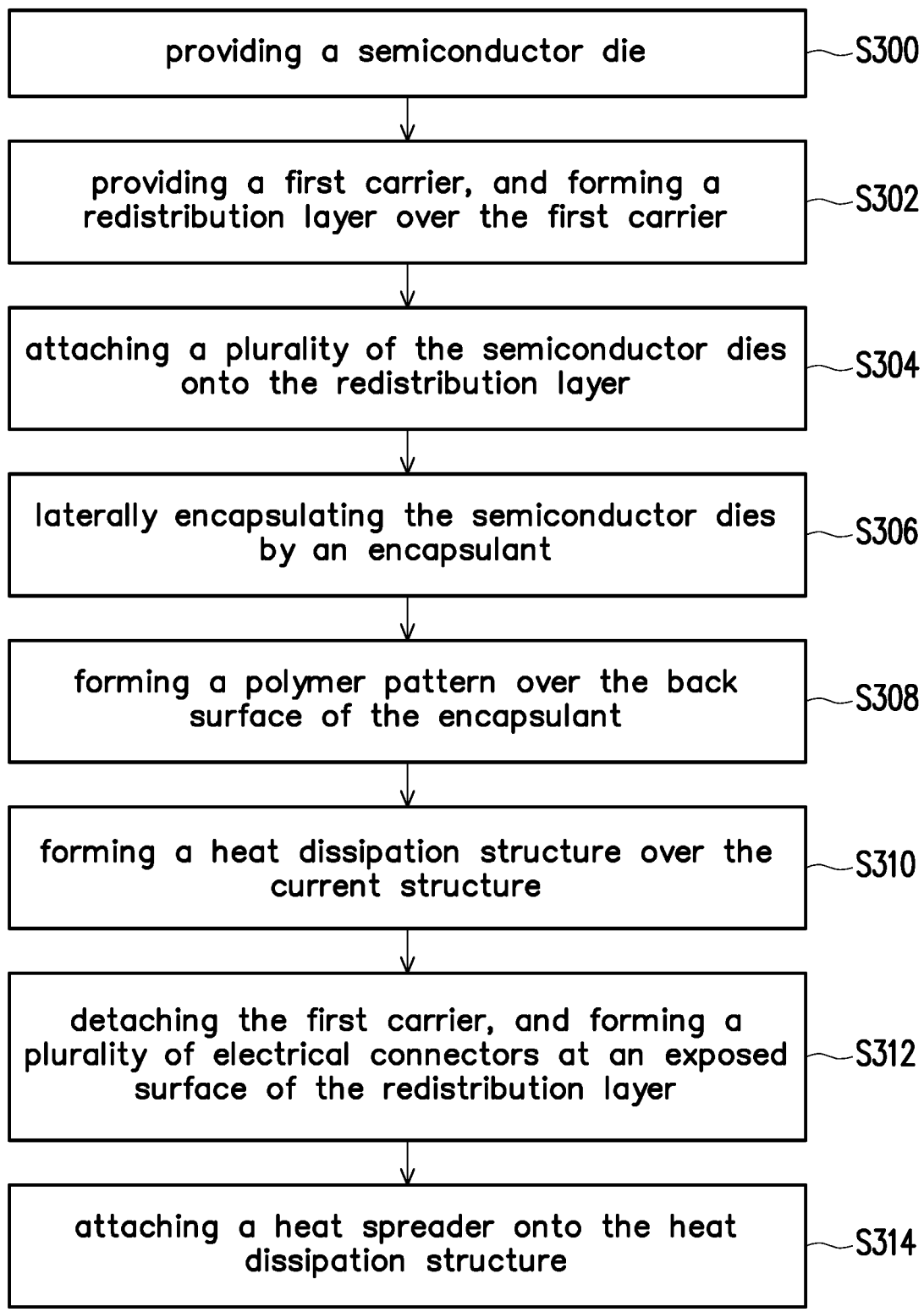
FIG. 6 is a process flow chart illustrating a manufacturing method of a semiconductor package according to some embodiments of the present disclosure.

FIG. 6 is a process flow chart illustrating a manufacturing method of a semiconductor package according to some embodiments of the present disclosure. FIG. 7A through FIG. 7G are cross-sectional views illustrating structures at various stages during the manufacturing process of the semiconductor package shown in FIG. 6. The embodiments to be illustrated with reference to FIG. 6 and FIG. 7A through FIG. 7G are similar to the embodiments illustrated with reference to FIG. 1 and FIG. 2A through FIG. 2I, only differences therebetween will be described, whereas the like or the same parts will not be repeated again. In addition, the like numeral references are designated as the similar components.

Figure 7A:
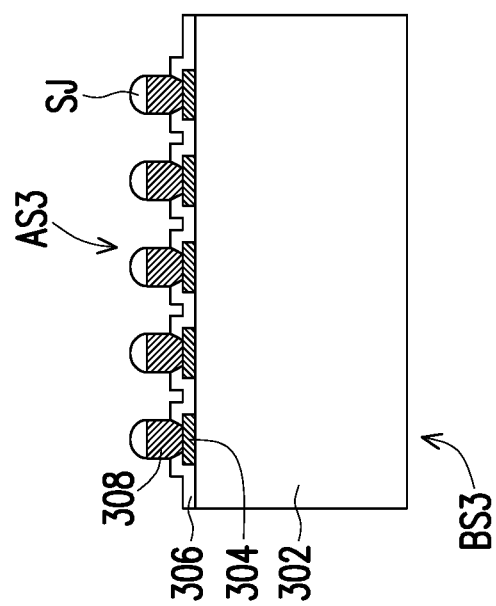

Referring to FIG. 6 and FIG. 7A, step S300 is performed, and a semiconductor die 300 is provided. The semiconductor die 300 is similar to the semiconductor die 100 shown in FIG. 2A, except that the semiconductor die 300 further has solder joints SJ at its active side AS3. As shown in FIG. 7A, the conductive pads 304 and a passivation layer 306 are sequentially disposed over a semiconductor substrate 302, and the passivation layer 306 has openings respectively exposing the conductive pads 304. The conductive pillars 308 are respectively disposed over the exposed portions of the conductive pads 304, and the solder joints SJ are respectively formed over the conductive pillars 308. In some embodiments, a material of the solder joint SJ includes tin, silver, copper or alloys thereof. On the other hand, a side of the semiconductor die 300 facing away from the active side AS3 is referred as a back side BS3.

Figure 7B:
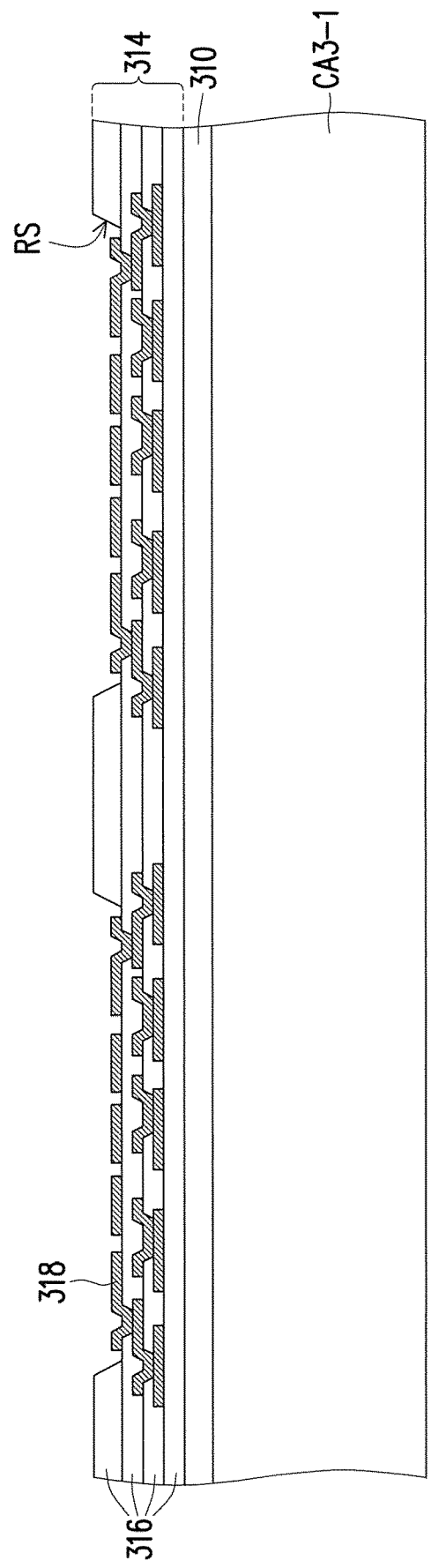
Figure 7C:
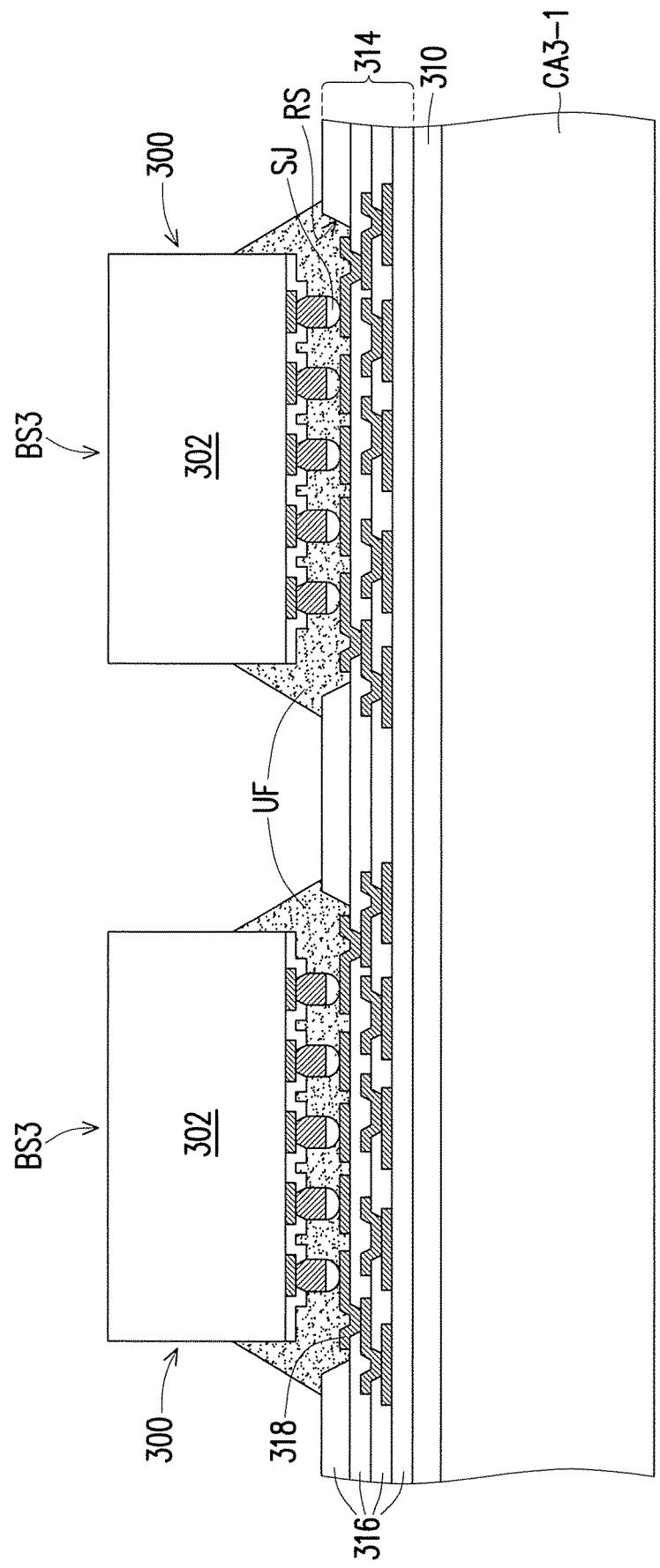

Referring to FIG. 6 and FIG. 7B, step S302 is performed, such that a first carrier CA3-1 is provided, and a redistribution layer 314 is formed over the first carrier CA3-1. In some embodiments, an adhesion layer 310, such as a LTHC layer or a thermal release layer, is pre-formed on a surface of the first carrier CA3-1 at which the redistribution layer 314 is formed. In addition, in some embodiments, the redistribution layer 314 includes a stack of insulating layers 316 and redistribution elements 318 formed in the stack of insulating layers 316. Some portions of the topmost insulating layer 316 may be removed to form openings exposing some of the topmost redistribution elements 318. As such, these exposed portions of the redistribution elements 318 can be electrically connected to the semiconductor dies 300 (and the passive device(s), which is not illustrated) to be attached onto the redistribution layer 314 in the following step (as shown in FIG. 7C). In addition, these openings in the topmost insulating layer 316 may be regarded as recesses RS at a top surface of the redistribution layer 314.

Referring to FIG. 6 FIG. 7A and FIG. 7C, step S304 is performed, and a plurality of the semiconductor dies 300 are attached onto the redistribution layer 314. Even though two of the semiconductor dies 300 are depicted as being attached onto the redistribution layer 314, a single semiconductor die 300 or more than three semiconductor dies 300 may be attached onto the redistribution layer 314. Furthermore, one or more passive devices may also be attached onto the redistribution layer 314. The attached semiconductor dies 300 (and the passive device(s)) may be respectively located in the openings of the topmost insulating layer 316 of the redistribution layer 314, and electrically connected to the exposed portions of the redistribution elements 318. The active sides AS3 of the semiconductor dies 300 are in contact with the redistribution layer 314 via the solder joints SJ, whereas the back sides BS3 of the semiconductor dies 300 face away from the redistribution layer 314. In some embodiments, spaces between the semiconductor substrates 302 and the redistribution layer 314 are respectively filled by an underfill UF. In these embodiments, the conductive pillars 308 and the solder joints SJ are laterally surrounded by the underfill UF. A material of the underfill UF may include liquid epoxy, deformable gel, silicon rubber or the like. In some embodiments, the underfill UF may be a polymer layer having filler materials (e.g., oxide, nitride, carbide, or the like) therein.

Figure 7D:
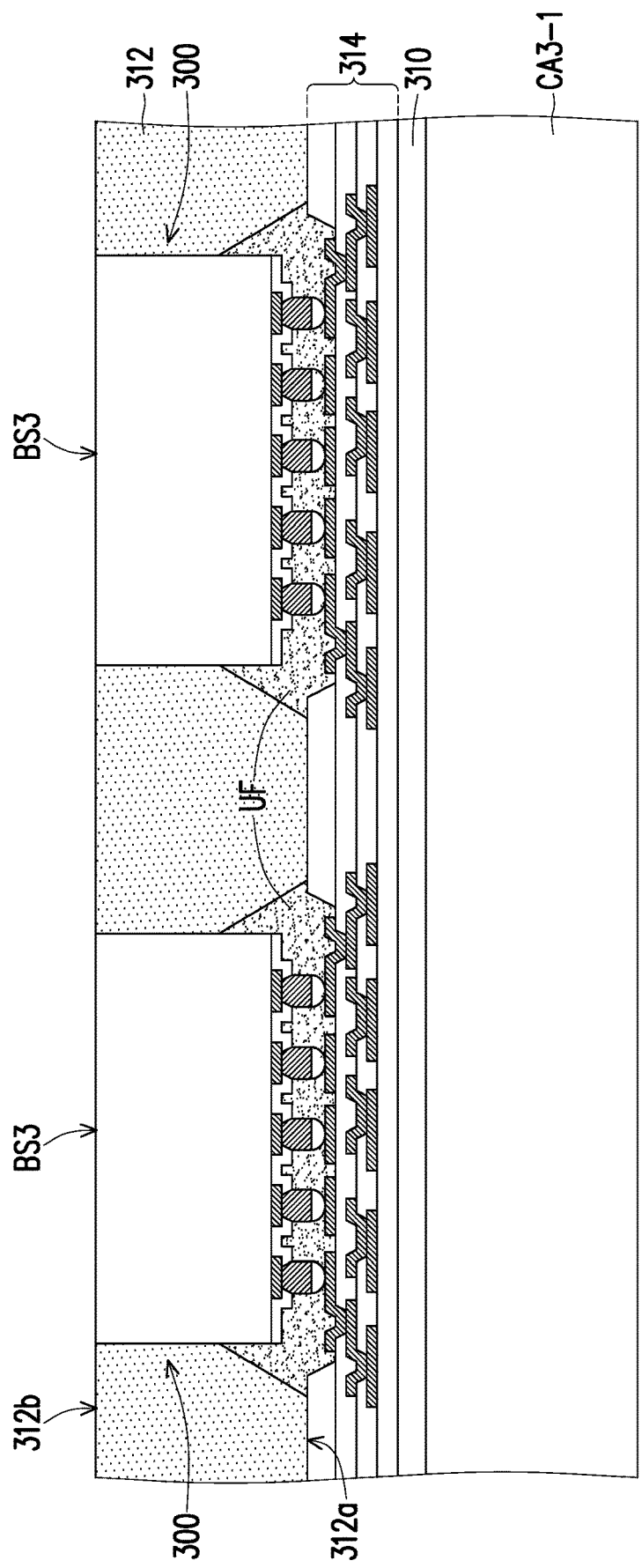

Referring to FIG. 6 and FIG. 7D, step S306 is performed, and the semiconductor dies 300 are laterally encapsulated by an encapsulant 312. The back sides BS3 of the semiconductor die 300 are exposed by the encapsulant 312. In some embodiments, a back surface 312b of the encapsulant 312 is substantially coplanar with back surfaces of the semiconductor substrates 302 at the back sides BS3 of the semiconductor dies 300. On the other side, a front surface 312a of the encapsulant 312 is in contact with the redistribution layer 314.

Figure 7E:
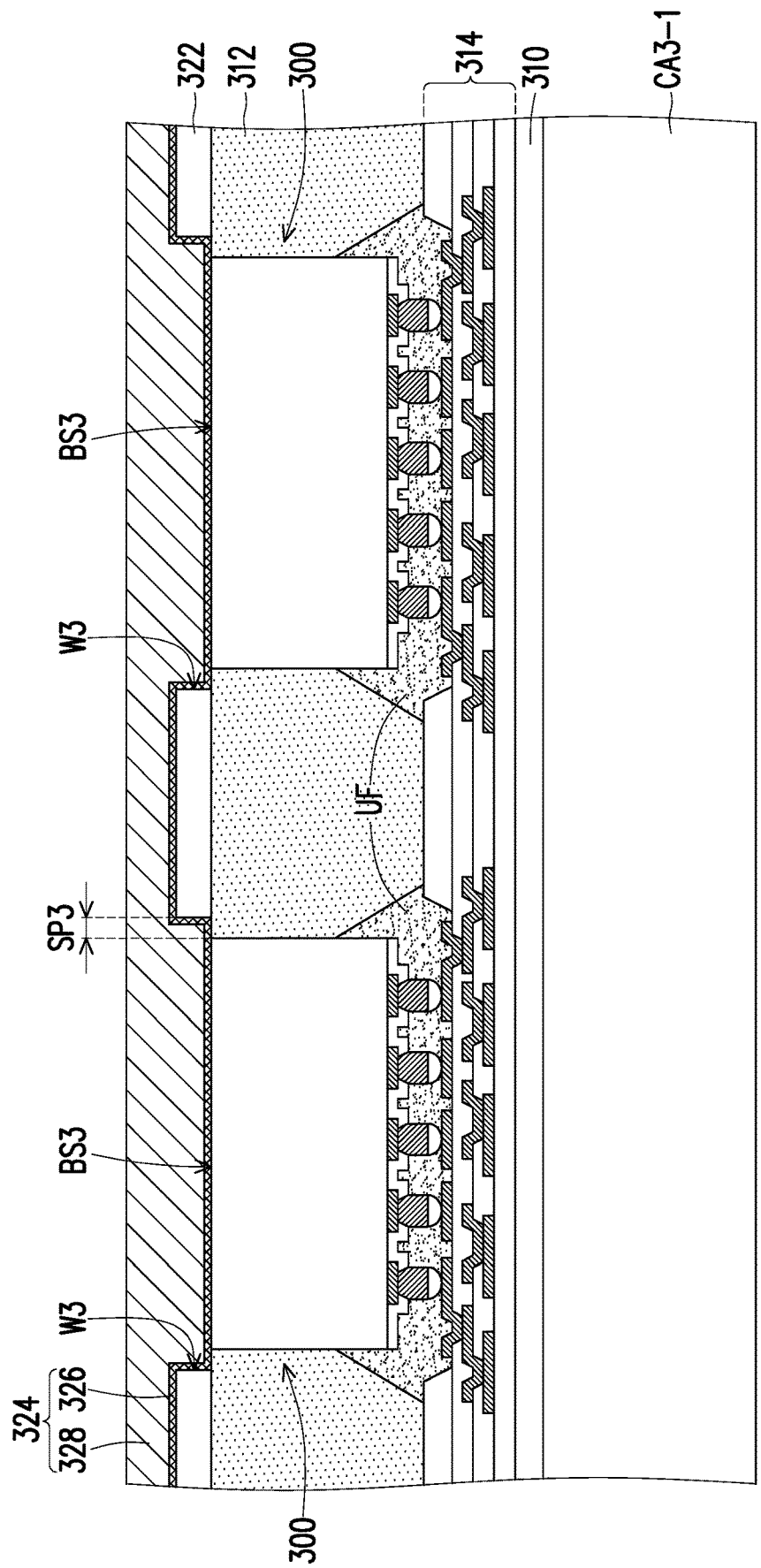

Referring to FIG. 6 and FIG. 7E, step S308 is performed, and a polymer pattern 322 is formed over the back surface 312b of the encapsulant 312. A portion of the encapsulant 312 surrounding each of the semiconductor dies 300 is covered by the polymer pattern 322. The polymer pattern 322 can be regarded as having a plurality of openings W3 respectively overlapped with one of the semiconductor dies 300. In some embodiments, the semiconductor dies 300 are not covered by the polymer pattern 322, and a non-zero spacing SP3 is in between a boundary of each opening W3 and the semiconductor die 300 therein. In alternative embodiments, the polymer pattern 322 further extends onto the back sides BS3 the semiconductor dies 300, and peripheral portions of the semiconductor dies 300 are covered by the polymer pattern 322. In other embodiments, the boundary of each opening W3 is substantially coplanar with a sidewall of the semiconductor die 300 located therein.

Subsequently, step S310 is performed, and a heat dissipation structure 324 is formed over the current structure. The openings W3 of the polymer pattern 322 can be regarded as being filled by the heat dissipation structure 324, and the heat dissipation structure 324 further extends onto the polymer pattern 322. As such, the back sides BS3 of the semiconductor dies 300 and the polymer pattern 322 are covered by the heat dissipation structure 324, and the heat dissipation structure 324 is in contact with the polymer pattern 322 along both lateral and vertical directions. In some embodiments, the heat dissipation structure 324 is in physical contact with the semiconductor dies 300, so as to effectively dissipate heat generated by the semiconductor dies 300. In addition, in some embodiments, the heat dissipation structure 324 includes a seed layer 326 and a conductive layer 328. The seed layer 326 is conformally formed over the semiconductor dies 300 and the polymer pattern 322, and the conductive layer 328 is formed over the seed layer 326. In some embodiments, the conductive layer 328 may have a substantially flat top surface. In these embodiments, a thickness of portions of the conductive layer 328 filled in the openings W3 is greater than a thickness of other portions of the conductive layer 328 located outside the openings W3.

Figure 7F:
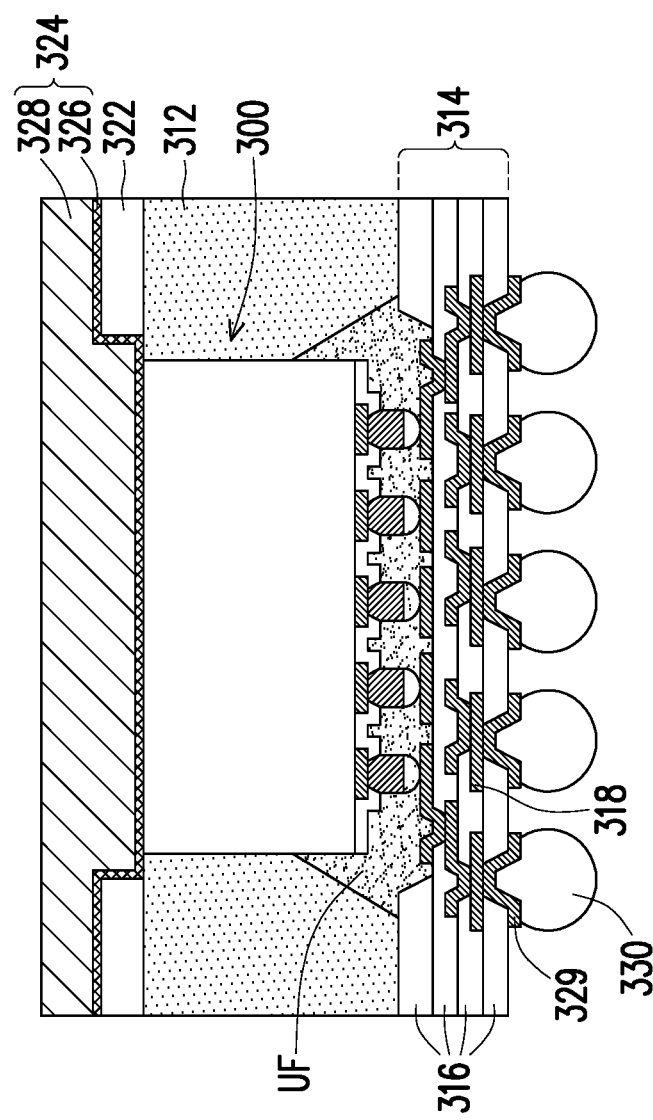

Referring to FIG. 6, FIG. 7E and FIG. 7F, step S312 is performed, such that the first carrier CA3-1 is detached, and a plurality of electrical connectors 330 are formed at an exposed surface of the redistribution layer 314. In those embodiments where the adhesion layer 310 formed on the first carrier CA3-1 is a LTHC release layer or a thermal release layer, the first carrier CA3-1 is detached from the redistribution layer 314 as the adhesion layer 310 lose its adhesive property when exposed to light or heat. After detaching the first carrier CA3-1, a singulation process may be performed on the current package structure. Each singulated package structure may contain one or more semiconductor dies 300 (e.g., one semiconductor die 300 as shown in FIG. 7F) laterally encapsulated by the encapsulant 312. Each semiconductor die 300 in one of the singulated package structures is surrounded by the overlying polymer pattern 322, and in contact with the heat dissipation structure 324. Subsequently, some portions of the currently exposed insulating layer 316 (e.g., the bottommost insulating layer 316 shown in FIG. 7F) may be removed to form openings exposing some portions of the redistribution elements 318 in the redistribution layer 314. Thereafter, the electrical connectors 330 may be respectively disposed at the exposed redistribution elements 318. In some embodiments, UBM layers 329 are formed at the exposed portions of the redistribution layer 314, such that the UBM layers 329 could be located between the redistribution layer 314 and the electrical connectors 330 after the electrical connectors 330 are formed.

According to the embodiments described above, the step of singulation follows the step of detaching the first carrier CA3-1, and precedes the step of forming the electrical connectors 330. However, in alternative embodiments, the step of forming the electrical connectors 330 may precede the step of detaching first carrier CA3-1 and the step of singulation. Those skilled in the art may adjust the order of these steps, the present disclosure is not limited thereto.

Referring to FIG. 6 and FIG. 7G, step S314 is performed, and a heat spreader 332 is attached onto the heat dissipation structure 224. In some embodiments, before attaching the heat spreader 332, a TIM layer 334 may be formed on a surface of the heat dissipation structure 324 on which the heat spreader 332 is subsequently attached.

Up to here, a semiconductor package 30 is formed. A structure of the semiconductor package 30 is similar to a structure of the semiconductor package 10 shown in FIG. 2I, except that the semiconductor die 300 of the semiconductor package 30 may further includes the solder joints SJ and the underfill UF. Moreover, a topmost insulating layer 316 of the redistribution layer 314 has an opening for accommodating the semiconductor die 300 attached onto the redistribution layer 314. Regarding a manufacturing process of the semiconductor package 30, the redistribution layer 314 is formed on the first carrier CA3-1 (as shown in FIG. 7B) before the active sides AS3 of the semiconductor dies 300 are attached onto the first carrier CA3-1 (as shown in FIG. 7C), and steps of attaching and detaching a second carrier (e.g., the second carrier CA1-2 shown in FIG. 2E or the second carrier CA2-2 shown in FIG. 5E) are omitted. Therefore, a manufacturing cost of the semiconductor package 30 can be further reduced.

As above, the semiconductor package according to embodiments in the present disclosure includes at least one semiconductor die, which is laterally encapsulated by an encapsulant. A redistribution layer is disposed at an active side of the semiconductor die(s) and a front surface of the encapsulant, whereas a polymer pattern is formed at a back surface of the encapsulant. As such, the encapsulant is located between the redistribution layer and the polymer pattern. A coefficient of thermal expansion (CTE) of the encapsulant may be greater than or less than the CTEs of the polymer pattern and the dielectric layers in the redistribution layer. Thereby, the stress caused by the CTE mismatch between the encapsulant and the dielectric layers can be at least partially cancelled by the stress caused by the CTE mismatch between the encapsulant and the polymer pattern. Accordingly, total stress in the semiconductor package can be reduced, and the semiconductor package may be less susceptible to warpage. Furthermore, the polymer pattern is formed over a portion of the encapsulant surrounding the semiconductor die(s), and can be regarded as having an opening overlapped with the semiconductor die(s). In this way, a heat dissipation structure covering the polymer pattern can be in physical contact with the semiconductor die(s). Therefore, heat generated by the semiconductor dies can be more effectively dissipated through the heat dissipation structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
    a semiconductor die, having a plurality of conductive pads at an active side of the semiconductor die;
    an encapsulant, laterally encapsulating the semiconductor die;
    a redistribution layer, disposed at the active side of the semiconductor die, and spanning over a front surface of the encapsulant, wherein the redistribution layer is electrically connected with the plurality of conductive pads;
    a polymer pattern, disposed at a back surface of the encapsulant that is facing away from the front surface of the encapsulant, wherein the semiconductor die is surrounded by the polymer pattern; and
    a heat dissipation structure, directly in physical contact with a back side of the semiconductor die that is facing away from the active side of the semiconductor die, and extending onto the polymer pattern,
    wherein the encapsulant is substantially coplanar with a bottom surface of the polymer pattern structure.

2. The semiconductor package according to claim 1, wherein a non-zero spacing is in between the polymer pattern and the semiconductor die.

3. The semiconductor package according to claim 1, wherein a sidewall of the polymer pattern is substantially coplanar with a sidewall of the semiconductor die.

4. The semiconductor package according to claim 1, wherein a peripheral portion of the semiconductor die is covered by the polymer pattern.

5. The semiconductor package according to claim 1, wherein the heat dissipation structure comprises:
    a seed layer, conformally formed over the polymer pattern and the back side of the semiconductor die; and
    a conductive layer, formed over the seed layer.

6. The semiconductor package according to claim 5, wherein a portion of the conductive layer overlapped with the semiconductor die has a first thickness, another portion of the conductive layer covering the polymer pattern has a second thickness, and the first thickness is greater than the second thickness.

7. The semiconductor package of claim 1, further comprising a heat spreader, disposed over the heat dissipation structure.

8. The semiconductor package of claim 1, wherein the semiconductor die further has a plurality of conductive pillars respectively disposed between the redistribution layer and one of the plurality of conductive pads.

9. The semiconductor package of claim 8, wherein the semiconductor die further has a plurality of solder joints respectively disposed between the redistribution layer and one of the plurality of conductive pillars.

10. The semiconductor package of claim 9, wherein a surface of the redistribution layer at which the semiconductor die is attached has a recess, and the semiconductor die is located in the recess.

11. The semiconductor package of claim 9, further comprising an underfill, laterally surrounding the plurality of conductive pillars and the plurality of solder joints.

12. The semiconductor package of claim 1, further comprising a plurality of electrical connectors, disposed at a surface of the redistribution layer facing away from the semiconductor die, and electrically connected to the redistribution layer.

* * * * *